US012772886B2

(12) United States Patent
Moon et al.

(10) Patent No.: US 12,772,886 B2
(45) Date of Patent: Oct. 20, 2026

(54) SEMICONDUCTOR PACKAGE INCLUDING CRACK PREVENTION LAYER

(71) Applicant: Samsung Electronics Co., Ltd., Suwon-si (KR)

(72) Inventors: Sungmin Moon, Suwon-si (KR); Pyoungwan Kim, Suwon-si (KR); Giho Jeong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 304 days.

(21) Appl. No.: 18/539,949

(22) Filed: Dec. 14, 2023

(65) Prior Publication Data

US 2024/0243054 A1 Jul. 18, 2024

(30) Foreign Application Priority Data

Jan. 17, 2023 (KR) ........................ 10-2023-0006991

(51) Int. Cl.
*H10W 70/65* (2026.01)
*H10B 80/00* (2026.01)
(Continued)

(52) U.S. Cl.
CPC ............ *H10W 70/65* (2026.01); *H10B 80/00* (2023.02); *H10W 90/00* (2026.01); *H10W 70/69* (2026.01);
(Continued)

(58) Field of Classification Search
CPC ..... H10W 70/65; H10W 80/00; H10W 90/00; H10W 72/884; H10W 74/15;
(Continued)

(56) References Cited

U.S. PATENT DOCUMENTS 8,399,779 B2 3/2013 Ogawa et al.
8,426,303 B2 4/2013 Suzuki et al.
(Continued)

FOREIGN PATENT DOCUMENTS

DE 102018108924 A1 1/2019

OTHER PUBLICATIONS

Office Action for Korean Application No. 10-2023-0006991 dated Aug. 19, 2026.

*Primary Examiner* — William B Partridge
*Assistant Examiner* — David Paul Sedorook
(74) *Attorney, Agent, or Firm* — Harness, Dickey & Pierce, P.L.C.

(57) ABSTRACT

A semiconductor package may include a first wiring structure, a second wiring structure on the first wiring structure, a semiconductor chip between the first wiring structure and the second wiring structure, and an expanded structure that electrically connects the first wiring structure with the second wiring structure and surrounds the semiconductor chip. At least one of the first wiring structure and the second wiring structure may include a first insulating layer on the semiconductor chip and the expanded structure, a first wiring layer on the first insulating layer, a second insulating layer covering the first insulating layer and the first wiring layer, a crack prevention layer on the second insulating layer, and a second wiring layer on the second insulating layer and the crack prevention layer. The second wiring layer may include a pad portion.

20 Claims, 33 Drawing Sheets

(51) Int. Cl.

| | |
|---|---|
| ***H10W 70/69*** | (2026.01) |
| ***H10W 72/00*** | (2026.01) |
| ***H10W 72/90*** | (2026.01) |
| ***H10W 74/10*** | (2026.01) |
| ***H10W 74/15*** | (2026.01) |
| ***H10W 90/00*** | (2026.01) |

(52) U.S. Cl.

CPC ........ *H10W 72/884* (2026.01); *H10W 72/952* (2026.01); *H10W 74/117* (2026.01); *H10W 74/15* (2026.01); *H10W 90/724* (2026.01); *H10W 90/734* (2026.01); *H10W 90/754* (2026.01); *H10W 90/794* (2026.01)

(58) Field of Classification Search

CPC . H10W 72/952; H10W 90/794; H10W 70/69; H10W 90/724; H10W 90/754; H10W 90/734; H10W 74/117

See application file for complete search history.

(56) References Cited

U.S. PATENT DOCUMENTS

| | | | | |
|---|---|---|---|---|
| 9,087,832 | B2 | 7/2015 | Huang et al. | |
| 9,379,065 | B2 | 6/2016 | Keser et al. | |
| 9,711,438 | B2 | 7/2017 | Lin et al. | |
| 11,942,435 | B2 * | 3/2024 | Wang | H10P 72/74 |
| 2002/0125543 | A1 | 9/2002 | Moon et al. | |
| 2013/0020685 | A1 * | 1/2013 | Kwak | H10W 42/20 257/659 |
| 2013/0328191 | A1 * | 12/2013 | Meyer | H10W 20/48 257/E23.141 |
| 2015/0162319 | A1 * | 6/2015 | Scharf | H10W 42/20 257/659 |
| 2015/0206934 | A1 * | 7/2015 | Funaya | H10D 1/20 438/3 |
| 2020/0051928 | A1 * | 2/2020 | Park | H10W 42/121 |

* cited by examiner

SEMICONDUCTOR PACKAGE INCLUDING CRACK PREVENTION LAYER

CROSS-REFERENCE TO RELATED APPLICATION

This application is based on and claims priority under 35 U.S.C. § 119 to Korean Patent Application No. 10-2023-0006991, filed on Jan. 17, 2023 in the Korean Intellectual Property Office, the disclosure of which is incorporated by reference herein in its entirety.

BACKGROUND

Inventive concepts relate to a semiconductor package, and more particularly, to a fan-out semiconductor package.

Due to the significant progress in the electronics industry and the demand of users, electronic devices are becoming more and more compact and multi-functional and may have greater capacity, thus a highly integrated semiconductor chip may be required.

Accordingly, a semiconductor package having connection terminals, with which connection reliability is ensured, is designed for highly integrated semiconductor chips in which the number of connection terminals for input/output (I/O) is increased. For example, to limit and/or prevent interference among connection terminals, a fan-out semiconductor package in which a distance between the connection terminals is increased is being developed.

SUMMARY

Inventive concepts provide a semiconductor package with improved electrical reliability.

According to an embodiment of inventive concepts, a semiconductor package may include a first wiring structure; a second wiring structure on the first wiring structure; a semiconductor chip between the first wiring structure and the second wiring structure; and an expanded structure that electrically connects the first wiring structure with the second wiring structure and surrounds the semiconductor chip. At least one of the first wiring structure and the second wiring structure may include a first insulating layer on the semiconductor chip and the expanded structure, a first wiring layer on the first insulating layer, a second insulating layer covering the first insulating layer and the first wiring layer, a crack prevention layer on the second insulating layer, and a second wiring layer on the second insulating layer and the crack prevention layer. The second wiring layer may include a pad portion. The crack prevention layer may overlap the pad portion in a vertical direction and may extend from an edge of the pad portion in a horizontal direction in a plan view. The crack prevention layer may be apart from the first wiring layer in the vertical direction with a portion of the second insulating layer therebetween.

According to embodiment of inventive concepts, a semiconductor package may include a first wiring structure including a plurality of first redistribution patterns and a plurality of first redistribution insulating layers surrounding the plurality of first redistribution patterns; a second wiring structure on the first wiring structure, the second wiring structure including a plurality of second redistribution patterns, a plurality of second redistribution insulating layers surrounding the plurality of second redistribution patterns, a crack prevention layer, and a plurality of upper surface connection pad layers; a semiconductor chip between the first wiring structure and the second wiring structure; and an expanded structure that electrically connects the plurality of first redistribution patterns with the plurality of second redistribution patterns and surrounds the semiconductor chip. The plurality of second redistribution insulating layers may include a first insulating layer, a second insulating layer, and a third insulating layer stacked on the semiconductor chip and the expanded structure. The plurality of second redistribution patterns may include a first wiring layer on the first insulating layer and covered by the second insulating layer, and a second wiring layer on the second insulating layer and the crack prevention layer. The second wiring layer may be partially covered by the third insulating layer. The second wiring layer may include a plurality of pad portions and a plurality of line portions extending from the plurality of pad portions. The plurality of upper surface connection pad layers may be on the plurality of pad portions, such that the plurality of pad portions and the plurality of upper surface connection pad layers form a plurality of upper surface connection pads. The crack prevention layer may overlap at least some of the plurality of pad portions in a vertical direction and may cover at least a portion of the second insulating layer such that the crack prevention layer is apart from the first wiring layer in the vertical direction with a portion of the second insulating layer therebetween. An edge region of the semiconductor package may surround a central region of the semiconductor package in a plan view.

According to an embodiment of inventive concepts, a semiconductor package may include a lower package, an upper package on the lower package, and a plurality of package connection terminals. The lower package may include a first wiring structure including a plurality of first redistribution patterns and a plurality of first redistribution insulating layers surrounding the plurality of first redistribution patterns, a second wiring structure on the first wiring structure, a semiconductor chip between the first wiring structure and the second wiring structure, and an expanded structure. The second wiring structure may include a plurality of second redistribution patterns, a plurality of second redistribution insulating layers surrounding the plurality of second redistribution patterns, a crack prevention layer, and a plurality of upper surface connection pad layers. The expanded structure may electrically connect the plurality of first redistribution patterns with the plurality of second redistribution patterns and may surround the semiconductor chip. The upper package may include an auxiliary semiconductor chip. The plurality of package connection terminals may be attached to the plurality of upper surface connection pad layers. The plurality of package connection terminals may electrically connect the lower package with the upper package. The plurality of second redistribution insulating layers may include a first insulating layer, a second insulating layer, and a third insulating layer stacked on the semiconductor chip and the expanded structure. The plurality of second redistribution patterns may include a first wiring layer on the first insulating layer and covered by the second insulating layer, and a second wiring layer on the second insulating layer and the crack prevention layer. The second wiring layer may be partially covered by the third insulating layer. The second wiring layer may include a plurality of pad portions and a plurality of line portions extending from the plurality of pad portions. The plurality of upper surface connection pad layers may be on the plurality of pad portions, such that the plurality of pad portions and the plurality of upper surface connection pad layers form a plurality of upper surface connection pads. The crack prevention layer may overlap at least some of the plurality of pad portions in a vertical direction and may cover at least a portion of the second insulating layer such that the crack prevention layer is apart from the first wiring layer in the vertical direction with a portion of the second insulating layer therebetween.

BRIEF DESCRIPTION OF THE DRAWINGS

Embodiments will be more clearly understood from the following detailed description taken in conjunction with the accompanying drawings in which.

DETAILED DESCRIPTION

Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Figure 1A:
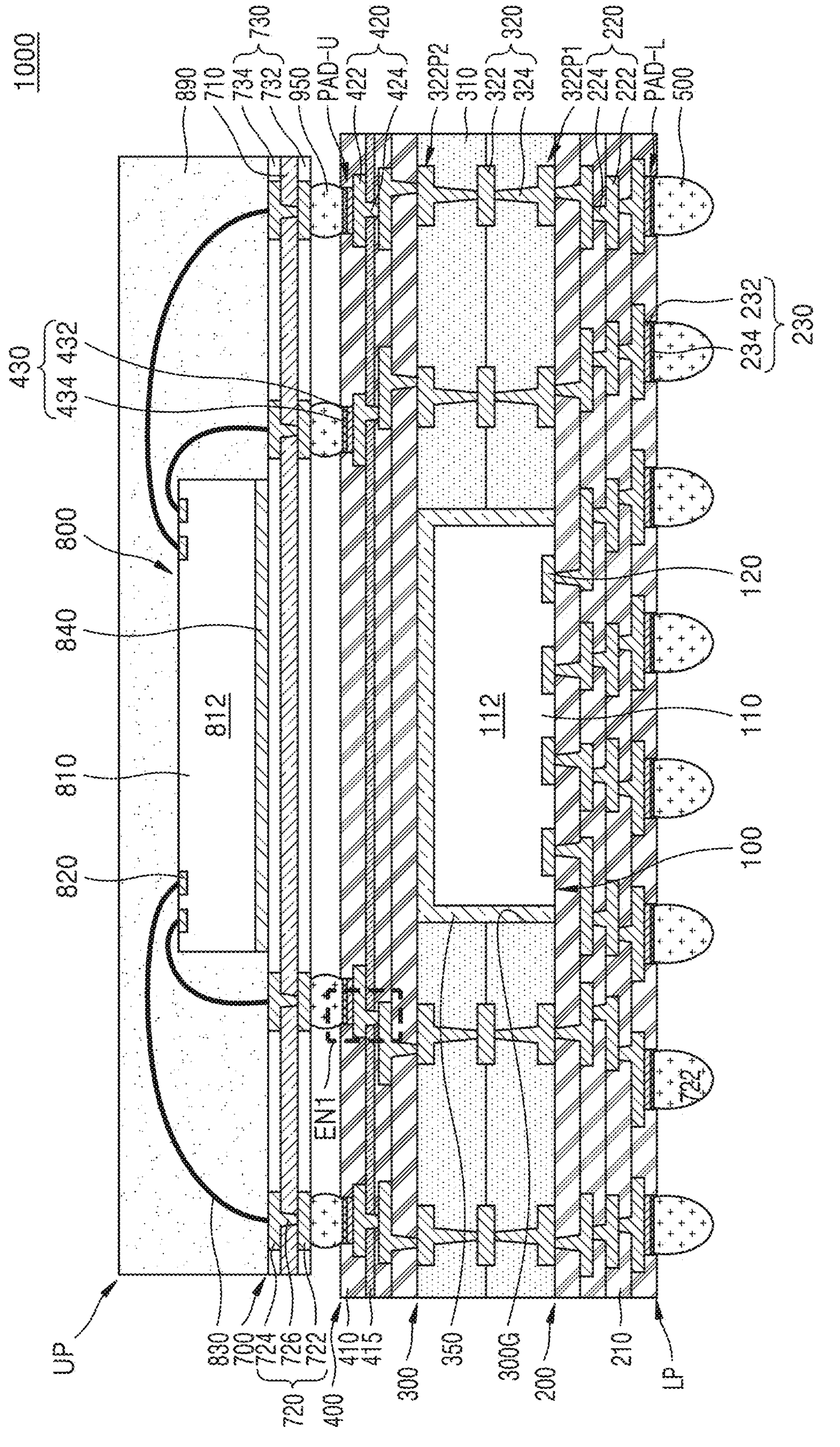
FIG. 1A is a cross-sectional view of a semiconductor package according to embodiments.
Figure 1B:
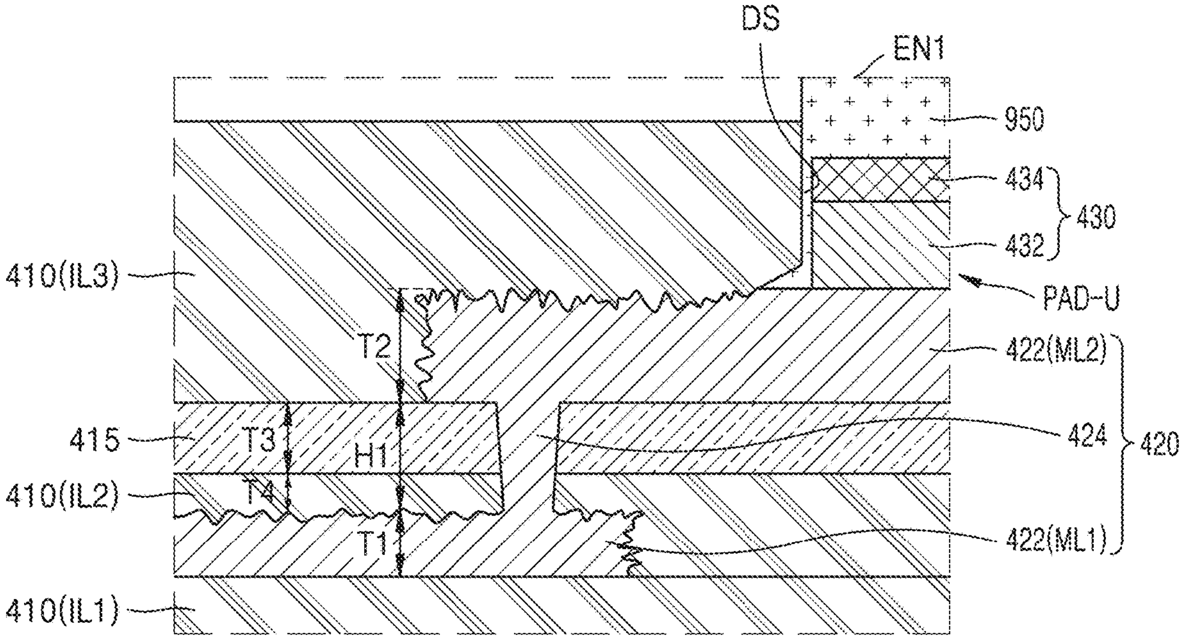
FIGS. 1B and 1C are enlarged cross-sectional views thereof.
Figure 1C:
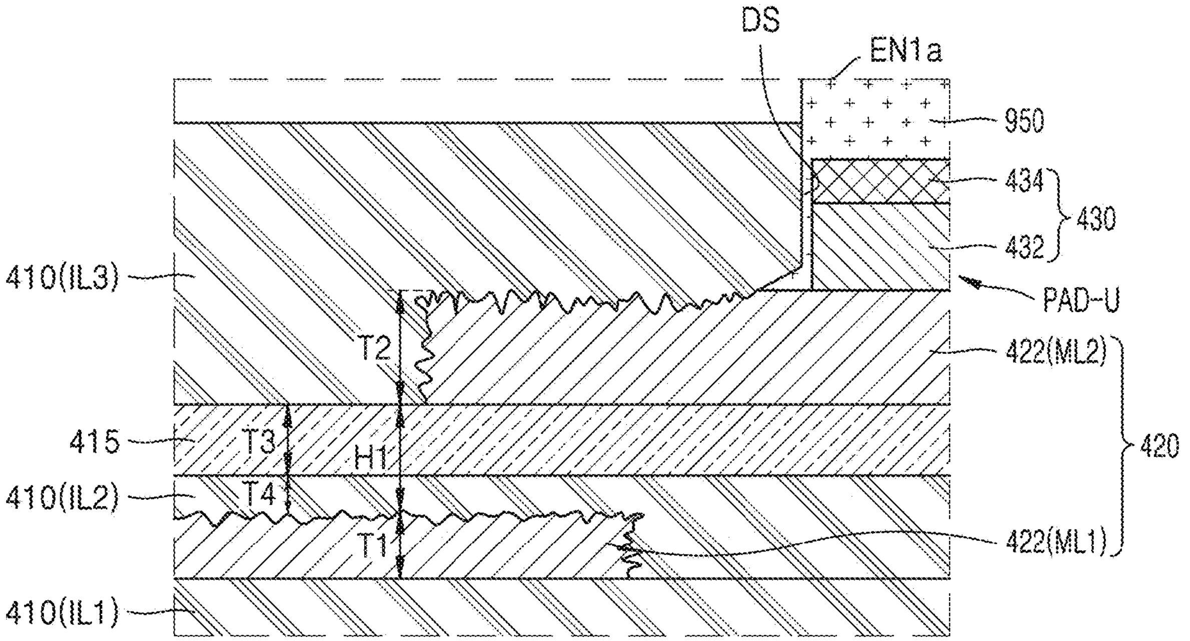

FIG. 1A is a cross-sectional view of a semiconductor package according to embodiments, and FIGS. 1B and 1C are enlarged cross-sectional views thereof. FIG. 1B is an enlarged cross-sectional view of an EN1 portion of FIG. 1A, and FIG. 1C is an enlarged cross-sectional view of a portion (indicated as EN1*a*) corresponding to the EN1 portion of FIG. 1A.

Referring to FIG. 1A, a semiconductor package 1000 may be a package-on-package (POP) including a lower package LP and an upper package UP attached onto the lower package LP. The lower package LP before the upper package UP is attached may be referred to as a semiconductor package, and the upper package UP before attached to the lower package LP may also be referred to as a semiconductor package.

The lower package LP may include a first wiring structure 200, a second wiring structure 400 on the first wiring structure 200, at least one semiconductor chip 100 arranged between the first wiring structure 200 and the second wiring structure 400, and an expanded structure 300 arranged between the first wiring structure 200 and the second wiring structure 400 and surrounding the at least one semiconductor chip 100. The expanded structure 300 may electrically connect the first wiring structure 200 with the second wiring structure 400. The expanded structure 300 may have a mounting space 300G in which the at least one semiconductor chip 100 is arranged. The lower package LP may be a fan-out type semiconductor package in which a horizontal width and horizontal area of the first wiring structure 200 is greater than a horizontal width and horizontal area of a footprint formed by the at least one semiconductor chip 100. In some embodiments, the lower package LP may be a fan-out-type panel-level package (FOPLP). In some embodiments, at least one of the first wiring structure 200 and the second wiring structure 400 may be formed by a redistribution process. The first wiring structure 200 and the second wiring structure 400 may be respectively referred to as a first redistribution structure and a second redistribution structure, or may be respectively referred to as a lower redistribution structure and an upper redistribution structure.

The first wiring structure 200 may include a first redistribution insulating layer 210 and a plurality of first redistribution patterns 220. The first redistribution insulating layer 210 may surround the plurality of first redistribution patterns 220. In some embodiments, the first wiring structure 200 may include a plurality of first redistribution insulating layers that are stacked. The first redistribution insulating layer 210 may include an organic material. For example, the first redistribution insulating layer 210 may include photo-imageable dielectric (PID) or photosensitive polyimide (PSPI), or may include a build-up film such as an Ajinomoto build-up film (ABF). For example, the first wiring structure 200 may have a thickness of about 30 μm to about 50 μm.

The plurality of first redistribution patterns 220 may include a plurality of first redistribution line patterns 222 and a plurality of first redistribution vias 224. The plurality of first redistribution patterns 220 may include, for example, copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Rc), beryllium (Be), gallium (Ga), ruthenium (Ru), or an alloy thereof, but are not limited thereto. In some embodiments, the plurality of first redistribution patterns 220 may be formed by stacking a metal or an alloy of metals on a seed layer including copper, titanium, titanium nitride, or titanium tungsten.

The plurality of first redistribution line patterns 222 may be arranged on at least one of an upper surface and lower surface of the first redistribution insulating layer 210. For example, when the first wiring structure 200 includes a plurality of first redistribution insulating layers 210 that are stacked, the plurality of first redistribution line patterns 222 may be arranged in at least some of the following ways: on an upper surface of the uppermost first redistribution insulating layer 210, on a lower surface of the lowermost first redistribution insulating layer 210, and between two adjacent first redistribution insulating layers 210 among the plurality of first redistribution insulating layers 210.

The plurality of first redistribution vias 224 may contact and be connected with some of the plurality of first redistribution line patterns 222, respectively, through at least one first redistribution insulating layer 210. In some embodiments, the plurality of first redistribution vias 224 may have a tapered shape that, from an upper side to a lower side, increases in horizontal width and extends. For example, the plurality of first redistribution vias 224 may have a horizontal width that increases away from the at least one semiconductor chip 100.

In some embodiments, at least some of the plurality of first redistribution line patterns 222 may be formed together with some of the plurality of first redistribution vias 224 to form an integral body. For example, the first redistribution line pattern 222 and the first redistribution via 224 which is in contact with an upper surface of the first redistribution line pattern 222 may be formed together to form an integral body. For example, each of the plurality of first redistribution vias 224 may have a horizontal width that decreases away from the first redistribution line pattern 222 of the integral body.

In some embodiments, an upper surface of the uppermost first redistribution insulating layer 210 and the uppermost surfaces of the plurality of first redistribution patterns 220, for example, an upper surface of the uppermost first redistribution via 224, may be located at the same vertical level, and thus, may be coplanar with each other.

The first wiring structure 200 may include a plurality of lower surface connection pads PAD-L arranged on a lower surface of the first wiring structure 200. In some embodiments, each of the plurality of lower surface connection pads PAD-L may include a portion of the first redistribution line pattern 222 and a lower surface connection pad layer 230 covering a lower surface of the portion of the first redistribution line pattern 222. The portion of the first redistribution line pattern 222 included in the lower surface connection pad PAD-L may be referred to as a first pad portion. In some embodiments, each of the first pad portion and the lower surface connection pad layer 230 may have a circular, elliptical, or polygonal planar shape. The lower surface connection pad layer 230 may include a first lower surface metal layer 232 and a second lower surface metal layer 234, which are sequentially stacked on the first pad portion. In some embodiments, the first lower surface metal layer 232 may include nickel (Ni), and the second lower surface metal layer 234 may include gold (Au), but inventive concepts are not limited thereto.

A plurality of external connection terminals 500 may be respectively attached to the plurality of lower surface connection pads PAD-L. The plurality of external connection terminals 500 may connect the semiconductor package 1000 with the outside. In some embodiments, each of the plurality of external connection terminals 500 may be a bump, a solder ball, or the like. For example, the external connection terminal 500 may have a height of about 100 μm to about 180 μm.

The expanded structure 300 may be arranged on the first wiring structure 200. The expanded structure 300 may include an expanded base layer 310 and a plurality of via structures 320. The plurality of via structures 320 may penetrate from an upper surface of the expanded base layer 310 to a lower surface thereof. The expanded structure 300 may be a printed circuit board (PCB), a ceramic substrate, a wafer for manufacturing a package, or an interposer. The expanded structure 300 may include one expanded base layer 310, but is not limited thereto. In some embodiments, the expanded structure 300 may include two or more expanded base layers 310 that are stacked. For example, the expanded structure 300 may be a multi-layer PCB.

The mounting space 300G may be formed as an opening or a cavity in the expanded structure 300. The mounting space 300G may be formed in a partial region of the expanded structure 300, for example, in a central region in a plan view. The mounting space 300G may be recessed from an upper surface of the expanded structure 300 to a certain depth, or may be formed to penetrate from the upper surface of the expanded structure 300 to a lower surface thereof. A dry etching, wet etching, screen printing, drill bit, or laser drilling process may be used to form the mounting space 300G.

The expanded base layer 310 may include at least one material selected from a phenol resin, an epoxy resin, and polyimide. The expanded base layer 310 may include at least one material selected from, for example, frame retardant 4 (FR4), tetrafunctional epoxy, polyphenylene ether, epoxy/polyphenylene oxide, bismaleimide triazine (BT), thermount, cyanate ester, polyimide, and liquid crystal polymer. The via structure 320 may include copper (Cu) or an alloy including copper (Cu). For example, the via structure 320 may have a structure in which copper (Cu) or an alloy including copper (Cu) is stacked on a seed layer including copper (Cu), titanium (Ti), titanium tungsten (TiW), titanium nitride (TiN), tantalum (Ta), tantalum nitride (TaN), chromium (Cr), Cu/Ti in which copper is stacked on titanium, or Cu/TiW in which copper is stacked on titanium tungsten. In some embodiments, the via structure 320 may include electrolytically deposited (ED) copper foil, rolled-annealed (RA) copper foil, stainless steel foil, aluminum foil, ultra-thin copper foil, sputtered copper, or a copper alloy.

Each of the plurality of via structures 320 may include a via connection pattern portion 322 and an extended via portion 324. The via connection pattern portion 322 may be arranged on the upper surface or lower surface of the expanded base layer 310. For example, when the expanded structure 300 includes a plurality of expanded base layers 310 that are stacked, the via connection pattern portion 322 may be arranged in at least some of the following ways: on an upper surface of the uppermost expanded base layer 310, on a lower surface of the lowermost expanded base layer 310, and between two adjacent expanded base layers 310 among the plurality of expanded base layers 310. The extended via portion 324 may penetrate the expanded base layer 310 and extend in the vertical direction. The extended via portion 324 may connect two via connection pattern portions 322 located at different vertical levels.

In some embodiments, the lower surface of the expanded base layer 310 and the lowermost surfaces of the plurality of via structures 320 may be located at the same vertical level, and thus, may be coplanar with each other. For example, when the expanded structure 300 includes a plurality of expanded base layers 310 that are stacked, a lower surface of the lowermost expanded base layer 310 among the plurality of expanded base layers 310 and the lowermost surfaces of the plurality of via structures 320 may be located at the same vertical level, and thus, may be coplanar with each other. For example, a lower surface of the lowermost expanded base layer 310, the lowermost surfaces of the plurality of via structures 320, an upper surface of the uppermost first redistribution insulating layer 210, and an upper surface of the uppermost first redistribution via 224 may be located at the same vertical level.

Among a plurality of via connection pattern portions 322 included in the plurality of via structures 320, each of the lowermost via connection pattern portions 322 may be referred to as a lower surface expansion connection pad 322P1, and each of the uppermost via connection pattern portions 322 may be referred to as an upper surface expansion connection pad 322P2. In some embodiments, a lower surface of the lowermost expanded base layer 310 and lower surfaces of a plurality of lower surface expansion connection pads 322P1 may be located at the same vertical level, and thus, may be coplanar with each other. For example, a lower surface of the lowermost expanded base layer 310, lower surfaces of a plurality of lower surface expansion connection pads 322P1, an upper surface of the uppermost first redistribution insulating layer 210, and an upper surface of the uppermost first redistribution via 224 may be located at the same vertical level.

The semiconductor package 1000 may further include a filling insulting layer 350 filling the mounting space 300G. The filling insulting layer 350 may fill a space between the at least one semiconductor chip 100 arranged in the mounting space 300G and the expanded base layer 310. For example, the filling insulating layer 350 may include a thermosetting resin such as an epoxy resin, a thermoplastic resin such as polyimide, or a resin in which a reinforcing material such as an inorganic filler is included in the thermosetting resin and the thermoplastic resin, and particularly, may include ABF, FT-4, BT, or the like. Alternatively, the filling insulating layer 350 may include a molding material such as an epoxy molding compound (EMC) or a photosensitive material such as a photoimageable encapsulant (PIE). In some embodiments, a portion of the filling insulting layer 350 may include an insulating material such as a silicon oxide film, a silicon nitride film, or a silicon oxynitride film.

The at least one semiconductor chip 100 may be attached onto the first wiring structure 200. The semiconductor chip 100 may include a semiconductor substrate 110 having an active surface and an inactive surface opposite to each other, a semiconductor device 112 formed on the active surface of the semiconductor substrate 110, and a plurality of chip pads 120 arranged on a first surface of the semiconductor chip 100. For example, the semiconductor chip 100 may have a thickness of about 70 μm to about 200 μm. Herein, the first surface of the semiconductor chip 100 and a second surface of the semiconductor chip 100 may be opposite to each other, and the second surface of the semiconductor chip 100 refers to the inactive surface of the semiconductor substrate 110. Since the active surface of the semiconductor substrate 110 is very close to the first surface of the semiconductor chip 100, illustration of separately dividing the active surface of the semiconductor substrate 110 and the first surface of the semiconductor chip 100 is omitted.

In some embodiments, the semiconductor chip 100 may a face down arrangement with the first surface facing the first wiring structure 200, and may be attached to an upper surface of the first wiring structure 200. For example, the semiconductor chip 100 may be arranged on the first wiring structure 200 such that the plurality of chip pads 120 face the first wiring structure 200. In this case, the first surface of the semiconductor chip 100 may be referred to as a lower surface of the semiconductor chip 100, and the second surface of the semiconductor chip 100 may be referred to as an upper surface of the semiconductor chip 100. Unless otherwise specified herein, an upper surface refers to a surface facing upward in the drawings, and a lower surface refers to a surface facing downward in the drawings.

The semiconductor substrate 110 may include, for example, a semiconductor material such as silicon (Si) or germanium (Ge). Alternatively, the semiconductor substrate 110 may include a compound semiconductor material such as silicon carbide (SiC), gallium arsenide (GaAs), indium arsenide (InAs), and indium phosphide (InP). The semiconductor substrate 110 may include a conductive region, for example, a well doped with impurities. The first semiconductor substrate 110 may have various device isolation structures such as a shallow trench isolation (STI) structure.

The semiconductor device 112 including a plurality of individual devices of various types may be formed on the active surface of the semiconductor substrate 110. The plurality of individual devices may include various microelectronic devices, for example, a metal-oxide-semiconductor field effect transistor (MOSFET) such as a complementary metal-oxide-semiconductor (CMOS) transistor, a system large scale integration (LSI), an active element, and a passive element. The plurality of individual devices may be electrically connected to the conductive region of the semiconductor substrate 110. The semiconductor device 112 may further include a conductive wire or a conductive plug, which electrically connects at least two of the plurality of individual devices, or the plurality of individual devices with the conductive region of the semiconductor substrate 110. In addition, each of the plurality of individual devices may be electrically separated from other neighboring individual devices by an insulating film.

In some embodiments, the semiconductor chip 100 may include a logic device. For example, the semiconductor chip 100 may be a central processing unit (CPU) chip, a graphics processing unit (GPU) chip, or an application processor (AP) chip. In some embodiments, when the semiconductor package 1000 includes a plurality of semiconductor chips 100, at least one of the plurality of semiconductor chips 100 may be a CPU chip, a GPU chip, or an AP chip, and at least one other thereof may be a memory semiconductor chip including a memory device. For example, the memory device may be a non-volatile memory device, such as flash memory, phase-change random access memory (PRAM), magnetoresistive random access memory (MRAM), ferroelectric random access memory (FeRAM), or resistive random access memory (RRAM). The flash memory may be, for example, NAND flash memory or V-NAND flash memory. In some embodiments, the memory device may be a volatile memory device such as a dynamic random access memory (DRAM) or a static random access memory (SRAM).

In some embodiments, the plurality of chip pads 120 may include aluminum (Al) or an alloy including aluminum (Al). The plurality of chip pads 120 may contact and be connected with some of the uppermost first redistribution vias 224, and a plurality of lower surface expansion connection pads 322P1 may contact and be connected with some other of the uppermost first redistribution vias 224.

In some embodiments, a lower surface of the at least one semiconductor chip 100, the lower surface of the expanded base layer 310, and a lower surface of the filling insulting layer 350 may be located at the same vertical level, and thus, may be coplanar with each other. In some embodiments, the lower package LP may be formed by a chip first method in which the expanded structure 300, the at least one semiconductor chip 100, and the filling insulting layer 350 are first formed, and then, the first wiring structure 200 is formed. For example, an upper surface of the uppermost first redistribution insulating layer 210, an upper surface of the uppermost first redistribution via 224, a lower surface of the chip pad 120, the lowermost surfaces of the plurality of via structures 320, the lower surface of the expanded base layer 310, and a lower surface of the filling insulting layer 350 may be located at the same vertical level.

The semiconductor package 1000 may further include the second wiring structure 400 arranged on the expanded structure 300 and the filling insulting layer 350. The second wiring structure 400 may include a second redistribution insulating layer 410 and a plurality of second redistribution patterns 420. The second redistribution insulating layer 410 may surround the plurality of second redistribution patterns 420. The second redistribution insulating layer 410 may include an organic material. The second redistribution insulating layer 410 may include, for example, PID or PSPI, or may include a build-up film such as ABF.

In some embodiments, the thickness of the second wiring structure 400 may be smaller than the thickness of the first wiring structure 200. For example, the second wiring structure 400 may have a thickness of about 20 μm to about 40 μm. In some embodiments, the second wiring structure 400 may include a plurality of second redistribution insulating layers 410 that are stacked. For example, the number of stacked second redistribution insulating layers 410 included in the second wiring structure 400 may be less than the number of stacked first redistribution insulating layers 210 included in the first wiring structure 200.

The plurality of second redistribution patterns 420 may include a plurality of second redistribution line patterns 422 and a plurality of second redistribution vias 424. The plurality of second redistribution patterns 420 may include a metal or an alloy of metals, but are not limited thereto. In some embodiments, the plurality of second redistribution patterns 420 may be formed by stacking a metal or an alloy of metals on a seed layer.

The plurality of second redistribution line patterns 422 may be arranged on at least one of an upper surface and lower surface of the second redistribution insulating layer 410. For example, when the second wiring structure 400 includes a plurality of second redistribution insulating layers 410 that are stacked, the plurality of second redistribution line patterns 422 may be arranged in at least some of the following ways: on an upper surface of the uppermost second redistribution insulating layer 410, on a lower surface of the lowermost second redistribution insulating layer 410, and between two adjacent second redistribution insulating layers 410 among the plurality of second redistribution insulating layers 410.

The plurality of second redistribution vias 424 may contact and connect with some of the plurality of second redistribution line patterns 422, respectively, through at least one second redistribution insulating layer 410. In some embodiments, the plurality of second redistribution vias 424 may have a tapered shape that, from an upper side to a lower side, increases in horizontal width and extend. For example, the plurality of second redistribution vias 424 may have a horizontal width that increases away from the at least one semiconductor chip 100. The lowermost second redistribution vias 424 among the plurality of second redistribution vias 424 may be respectively connected with a plurality of upper surface expansion connection pads 322P2.

In some embodiments, at least some of the plurality of second redistribution line patterns 422 may be formed together with some of the plurality of second redistribution vias 424 to form an integral body. For example, the second redistribution line pattern 422 and the second redistribution via 424 which is in contact with a lower surface of the second redistribution line pattern 422 may be formed together to form an integral body. For example, each of the plurality of second redistribution vias 424 may have a horizontal width that decreases away from the second redistribution line pattern 422 of the integral body.

The second wiring structure 400 may include a plurality of upper surface connection pads PAD-U arranged on an upper surface of the second wiring structure 400. In some embodiments, each of the plurality of upper surface connection pads PAD-U may include a portion of the second redistribution line pattern 422 and an upper surface connection pad layer 430 covering an upper surface of the portion of the second redistribution line pattern 422. The portion of the second redistribution line pattern 422 included in the upper surface connection pad PAD-U may be referred to as a second pad portion. In some embodiments, each of the second pad portion and the upper surface connection pad layer 430 may have a circular, elliptical, or polygonal planar shape. The upper surface connection pad layer 430 may include a first upper surface metal layer 432 and a second upper surface metal layer 434, which are sequentially stacked on the second pad portion. In some embodiments, the first upper surface metal layer 432 may include nickel (Ni), and the second upper surface metal layer 434 may include gold (Au), but inventive concepts are not limited thereto.

The second wiring structure 400 may further include an upper crack prevention layer 415. The second pad portions may be portions of the uppermost second redistribution line patterns 422. The upper crack prevention layer 415 may cover lower surfaces of the uppermost second redistribution line patterns 422. For example, the upper crack prevention layer 415 may cover all portions of the lower surfaces of the uppermost second redistribution line patterns 422, to which the second redistribution vias 424 are not connected. The upper crack prevention layer 415 may completely cover the upper surface of the second redistribution insulating layer 410 arranged at lower sides of the uppermost second redistribution line patterns 422 among the plurality of second redistribution line patterns 422. For example, a lower surface of the upper crack prevention layer 415 may be in contact with the upper surface of the second redistribution insulating layer 410 arranged at the lower sides of the uppermost second redistribution line patterns 422. The second redistribution vias 424 connected with the uppermost second redistribution line patterns 422 may penetrate the upper crack prevention layer 415 and the second redistribution insulating layer 410 arranged at the lower sides of the uppermost second redistribution line patterns 422.

The upper package UP may be attached onto the second wiring structure 400. For example, the upper package UP may be connected to the plurality of upper surface connection pads PAD-U. For example, a plurality of package connection terminals 950 may be arranged between the upper package UP and the plurality of upper surface connection pads PAD-U. For example, the plurality of package connection terminals 950 may be respectively attached to a plurality of upper surface connection pad layers 430. The plurality of package connection terminals 950 may electrically connect the lower package LP with the upper package UP. In some embodiments, each of the plurality of package connection terminals 950 may be a bump, a solder ball, or the like.

The upper package UP includes a package substrate 700 and an auxiliary semiconductor chip 800 mounted on the package substrate 700. The auxiliary semiconductor chip 800 may include an auxiliary semiconductor substrate 810 having an active surface and an inactive surface opposite to each other, an auxiliary semiconductor device 812 formed on the active surface of the auxiliary semiconductor substrate 810, and a plurality of auxiliary chip pads 820 arranged on a third surface of the auxiliary semiconductor chip 800. The third surface of the auxiliary semiconductor chip 800 and a fourth surface of the auxiliary semiconductor chip 800 are opposite to each other, and the fourth surface of the auxiliary semiconductor chip 800 refers to the inactive surface of the auxiliary semiconductor substrate 810. Since the active surface of the auxiliary semiconductor substrate 810 is very close to the third surface of the auxiliary semiconductor chip 800, illustration of separately dividing the active surface of the auxiliary semiconductor substrate 810 and the third surface of the auxiliary semiconductor chip 800 is omitted.

The auxiliary semiconductor chip 800 may be a memory semiconductor chip. For example, the auxiliary semiconductor chip 800 may be a DRAM chip, an SRAM chip, a flash memory chip, an electrically erasable programmable read-only memory (EEPROM) chip, an MRAM chip, or an RRAM chip. The auxiliary semiconductor substrate 810 and the auxiliary chip pad 820 are respectively similar to the semiconductor substrate 110 and the chip pad 120, and thus, detailed descriptions thereof are omitted. The semiconductor chip 100, the semiconductor substrate 110, the semiconductor device 112, and the chip pad 120 may be respectively referred to as a first semiconductor chip, a first semiconductor substrate, a first semiconductor device, and a first chip pad, and the auxiliary semiconductor chip 800, the auxiliary semiconductor substrate 810, the auxiliary semiconductor device 812, and the auxiliary chip pad 820 may be respectively referred to as a second semiconductor chip, a second semiconductor substrate, a second semiconductor device, and a second chip pad.

In some embodiments, the auxiliary semiconductor chip 800 may be electrically connected with the package substrate 700 via a plurality of bonding wires 830 respectively connected to the plurality of auxiliary chip pads 820, and may be mounted on the package substrate 700 by using a die attach film (DAF) 840. In some embodiments, the upper package UP may include a plurality of auxiliary semiconductor chips 800 that are apart from each other in the horizontal direction, and may include a plurality of auxiliary semiconductor chips 800 that are stacked in the vertical direction. Alternatively, the upper package UP may include a plurality of auxiliary semiconductor chips 800 that are electrically connected with each other via a through electrode and are stacked in the vertical direction. Alternatively, the auxiliary semiconductor chip 800 may be mounted on the package substrate 700 in a flip chip method.

The package substrate 700 may be a PCB. For example, the package substrate 700 may be a double-sided PCB or a multi-layer PCB. The package substrate 700 may include at least one base insulating layer 710 and a plurality of wiring patterns 720. The plurality of wiring patterns 720 may include a plurality of lower surface conductive patterns 722, a plurality of upper surface conductive patterns 724, and a plurality of via patterns 726. The plurality of lower surface conductive patterns 722 may be arranged on a lower surface of the base insulating layer 710, the plurality of upper surface conductive patterns 724 may be arranged on an upper surface of the base insulating layer 710, and the plurality of via patterns 726 may electrically connect the plurality of lower surface conductive patterns 722 with the plurality of upper surface conductive patterns 724 through the base insulating layer 710. The base insulating layer 710 and the wiring pattern 720 are respectively similar to the expanded base layer 310 and the via structure 320, and thus, detailed descriptions thereof are omitted. FIG. 1A illustrates that the package substrate 700 includes one base insulating layer 710, but this is only an example, and inventive concepts are not limited thereto. For example, the package substrate 700 may include two or more base insulating layers 710 that are stacked, and may further include a conductive pattern arranged between the two or more base insulating layers 710.

In some embodiments, the package substrate 700 may include a solder resist layer 730 arranged on an upper surface and lower surface of the package substrate 700. The solder resist layer 730 may include a lower surface solder resist layer 732 arranged on the lower surface of the package substrate 700 and an upper surface solder resist layer 734 arranged on the upper surface of the package substrate 700. The plurality of lower surface conductive patterns 722 of the plurality wiring patterns 720 may be exposed to the lower surface of the package substrate 700 without being covered by the lower surface solder resist layer 732, and the plurality of upper surface conductive patterns 724 of the plurality of wiring patterns 720 may be exposed to the upper surface of the package substrate 700 without being covered by the upper surface solder resist layer 734.

The plurality of package connection terminals 950 may be respectively attached to the plurality of lower surface conductive patterns 722, and the plurality of bonding wires 830 may be respectively connected to the plurality of upper surface conductive patterns 724.

In some embodiments, the upper package UP may further include a package molding layer 890, which surrounds the auxiliary semiconductor chip 800 and the plurality of bonding wires 830, on the package substrate 700. For example, the package molding layer 890 may be a molding member including an EMC.

Referring to FIGS. 1A to 1C together, the second wiring structure 400 may include a plurality of second redistribution insulating layers 410 that are stacked. For example, FIG. 1B may be a cross-sectional view taken along a region where the second redistribution via 424 is arranged, and FIG. 1C may be a cross-sectional view taken along a region where the second redistribution via 424 is not arranged. In some embodiments, some of the plurality of upper surface connection pads PAD-U may each be a dummy pad to which the second redistribution via 424 is not connected, and FIG. 1C may be a cross-sectional view taken along the dummy pad among the plurality of upper surface connection pads PAD-U.

For example, the plurality of second redistribution insulating layers 410 may include a first insulating layer IL1, a second insulating layer IL2, and a third insulating layer IL3, which are sequentially stacked on the expanded structure 300. The plurality of second redistribution line patterns 422 may include a first wiring layer ML1 arranged on the first insulating layer IL1 and a second wiring layer ML2 arranged on the second insulating layer IL2. The first insulating layer IL1, the second insulating layer IL2, the third insulating layer IL3, the first wiring layer ML1, and the second wiring layer ML2 may be respectively referred to as a first upper insulating layer, a second upper insulating layer, a third upper insulating layer, a first upper wiring layer, and a second upper wiring layer. In some embodiments, upper surfaces and side surfaces of the first wiring layer ML1 and the second wiring layer ML2, that is, the plurality of second redistribution line patterns 422, may have roughness, and lower surfaces thereof may be relatively flat. For example, after the second redistribution line pattern 422 is formed, an upper surface and side surface of the second redistribution line pattern 422 are subjected to a surface treatment process to have roughness. The roughness of the upper surface and side surface of the second redistribution line pattern 422 may improve adhesion between the second redistribution line pattern 422 and the second redistribution insulating layer 410 covering the second redistribution line pattern 422.

Each of the plurality of upper surface connection pads PAD-U may include a portion of the second wiring layer ML2 and the upper surface connection pad layer 430 covering an upper surface of the portion of the second wiring layer ML2. The portion of the second wiring layer ML2 included in the upper surface connection pad PAD-U may be referred to as a second pad portion. The package connection terminal 950 may be attached to the upper surface connection pad layer 430. An upper surface of the upper surface connection pad layer 430, that is, an upper surface of the second upper surface metal layer 434, may be located at a vertical level lower than that of an upper surface of the uppermost second redistribution insulating layer 410, for example, the third insulating layer IL3. For example, the upper surface connection pad layer 430 may be arranged to be recessed into the third insulating layer IL3.

In some embodiments, since delamination occurs between the second redistribution insulating layer 410, for example, the third insulating layer IL3, and the upper surface connection pad layer 430, a side surface of the third insulating layer IL3 and a side surface of the upper surface connection pad layer 430 may be apart from each other, and thus, a delamination space DS may be defined between the side surface of the third insulating layer IL3 and the side surface of the upper surface connection pad layer 430. The package connection terminal 950 may cover the upper surface of the upper surface connection pad layer 430 and fill at least a portion of the delamination space DS. For example, the package connection terminal 950 may extend from the upper surface of the upper surface connection pad layer 430 into the delamination space DS while covering the side surface of the third insulating layer IL3 and the side surface of the upper surface connection pad layer 430, and thus, may cover a portion of an upper surface of the second pad portion of the second wiring layer ML2.

The upper crack prevention layer 415 may cover a lower surface of the second wiring layer ML2. For example, the upper crack prevention layer 415 may cover all portions of the lower surface of the second wiring layer ML2, to which the second redistribution via 424 is not connected. The upper crack prevention layer 415 may completely cover an upper surface of the second insulating layer IL2. For example, the lower surface of the upper crack prevention layer 415 may be in contact with the upper surface of the second insulating layer IL2. The upper crack prevention layer 415 may be apart from the first wiring layer ML1 in the vertical direction with the second insulating layer IL2 therebetween. The second insulating layer IL2 and the upper crack prevention layer 415 may be arranged between the first wiring layer ML1 and the second wiring layer ML2. The second redistribution via 424 connected with the second wiring layer ML2 may be connected with the first wiring layer ML1 through the upper crack prevention layer 415 and the second insulating layer IL2. The third insulating layer IL3 may cover the upper crack prevention layer 415 and the second wiring layer ML2. For example, the third insulating layer IL3 may cover an upper surface of the upper crack prevention layer 415 and an upper surface and side surface of the second wiring layer ML2. The upper crack prevention layer 415 may include a material having a modulus lower than that of the second redistribution insulating layer 410, or a material having a fracture toughness higher than that of the second redistribution insulating layer 410. For example, the upper crack prevention layer 415 may include an organic material such as polydimethylsiloxane (PDMS) having a modulus lower than that of the second redistribution insulating layer 410, or may include an inorganic material such as silicon oxide or silicon nitride having a fracture toughness higher than that of the second redistribution insulating layer 410.

The first wiring layer ML1 may have a first thickness T1, and the second wiring layer ML2 may have a second thickness T2. In some embodiments, the second thickness T2 may be greater than the first thickness T1. For example, the first thickness T1 may be about 4 μm to about 8 μm, and the second thickness T2 may be about 6 μm to about 15 μm. The upper crack prevention layer 415 may have a third thickness T3, and the second insulating layer IL2 on the first wiring layer ML1 may have a fourth thickness T4. The fourth thickness T4 may be a thickness of a portion of the second insulating layer IL2 arranged between an upper surface of the first wiring layer ML1 and the lower surface of the upper crack prevention layer 415. The lower surface of the second wiring layer ML2 may be located at a first height H1 from the upper surface of the first wiring layer ML1. The third thickness T3 may be equal to or greater than the first thickness T1. For example, the third thickness T3 may be about 4 μm to about 10 μm. The fourth thickness T4 may be smaller than each of the first thickness T1 and the third thickness T3. For example, the fourth thickness T4 may be about 2 μm to about 6 μm. The first height H1 may be the sum of the third thickness T3 and the fourth thickness T4. For example, the first height H1 may be about 6 μm to about 12 μm.

When heat is applied to the semiconductor package 1000 during a process for forming the third insulating layer IL3 or a process for forming the package connection terminal 950, delamination may occur between the upper surface connection pad PAD-U and the third insulating layer IL3. The delamination that has occurred between the upper surface connection pad PAD-U and the third insulating layer IL3 may extend along the upper surface and side surface of the second wiring layer ML2, resulting in a crack in the second insulating layer IL2. When the crack that has occurred in the second insulating layer IL2 extends from the upper surface of the second insulating layer IL2 to a lower surface thereof, the crack may also extend to the first wiring layer ML1 below the second insulating layer IL2, resulting in an open defect in which the first wiring layer ML1 is cut.

However, since the semiconductor package 1000 according to embodiments of inventive concepts includes the upper crack prevention layer 415 including a material having a modulus lower than that of the second redistribution insulating layer 410 or a material having a fracture toughness higher than that of the second redistribution insulating layer 410, delamination that has occurred between the upper surface connection pad PAD-U and the third insulating layer IL3 may not cause a crack in the second insulating layer IL2 even when extending along the upper surface and side surface of the second wiring layer ML2. In addition, since the third thickness T3 of the upper crack prevention layer 415 is equal to or greater than the first thickness T1 of the first wiring layer ML1, even when delamination that has occurred between the upper surface connection pad PAD-U and the third insulating layer IL3 extends along the upper surface and side surface of the second wiring layer ML2 and causes a crack in the upper crack prevention layer 415, the crack may not extend from the upper surface of the upper crack prevention layer 415 to the lower surface thereof, thereby limiting and/or preventing the crack from occurring in the second insulating layer IL2. Therefore, the semiconductor package 1000 according to embodiments of inventive concepts may limit and/or prevent an open defect from occurring in the first wiring layer ML1, such that electrical reliability may be ensured.

Figure 2A:
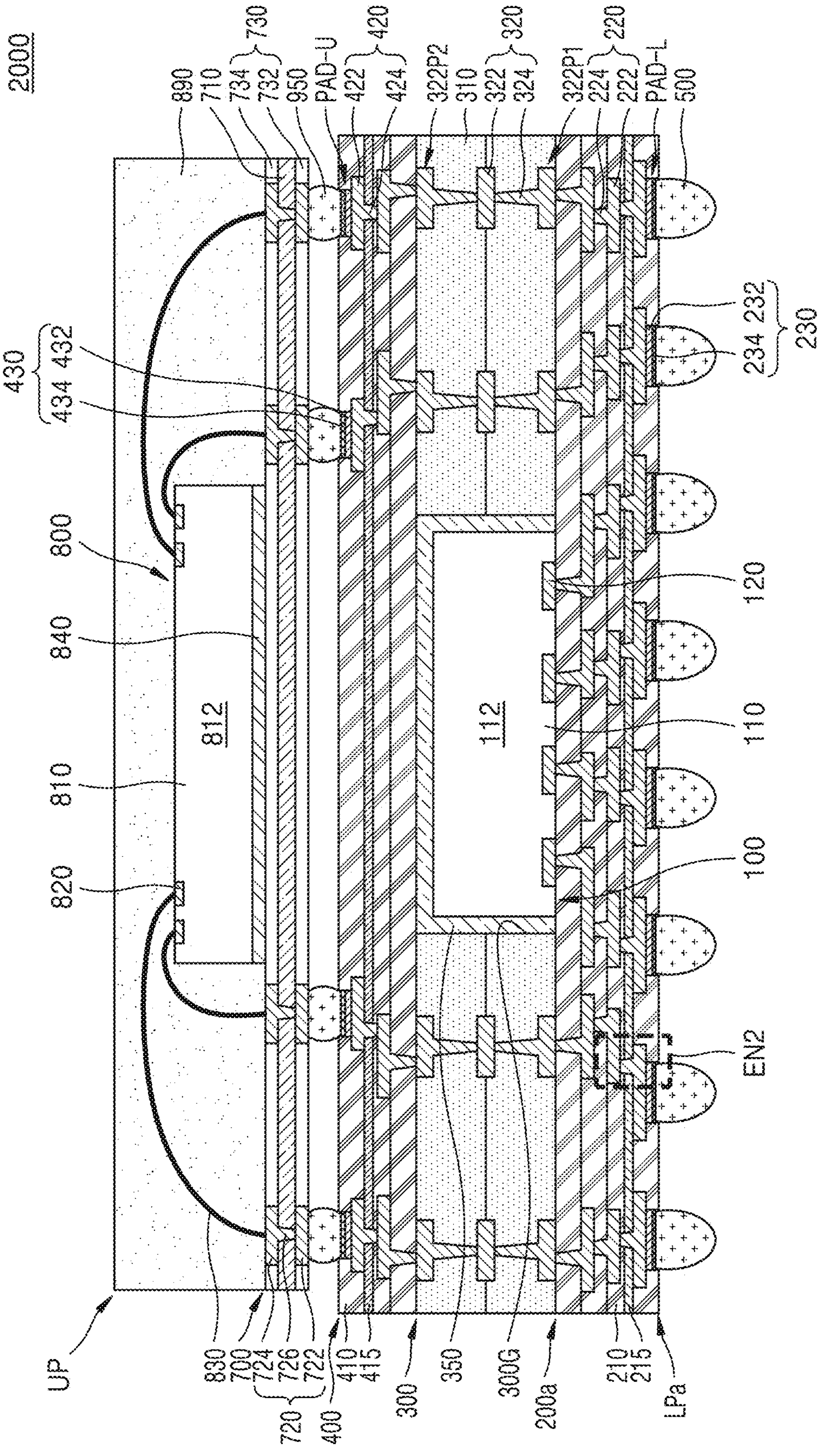
FIG. 2A is a cross-sectional view of a semiconductor package according to embodiments.
Figure 2B:
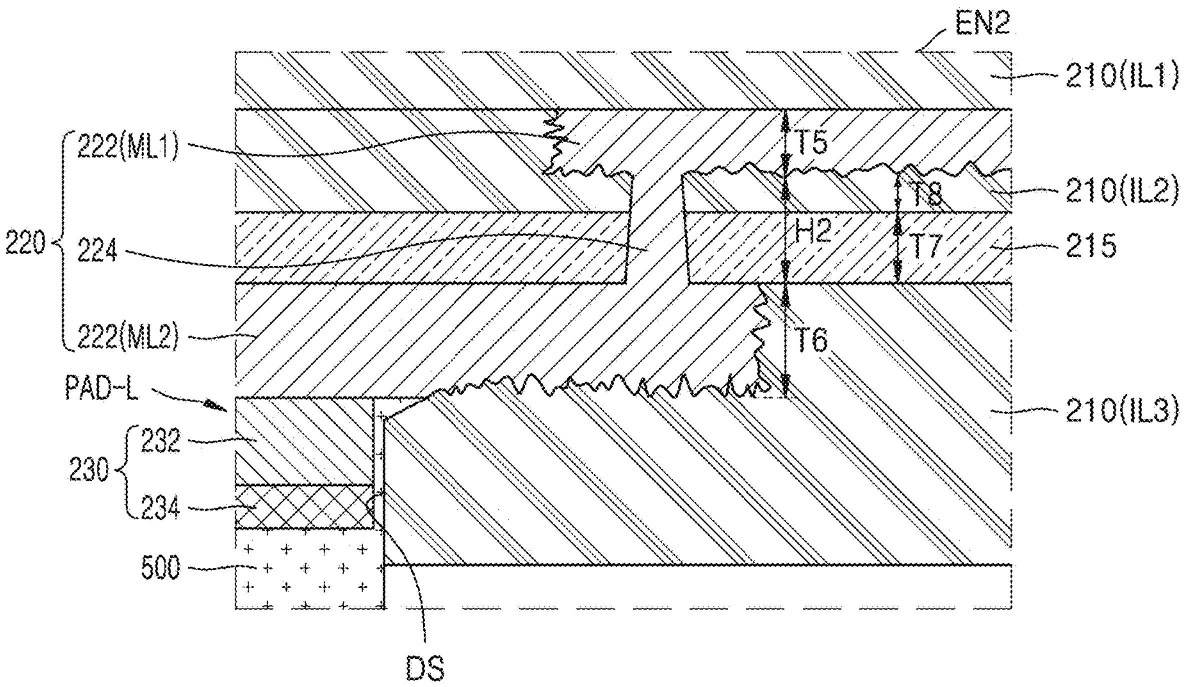
FIGS. 2B and 2C are enlarged cross-sectional views thereof.
Figure 2C:
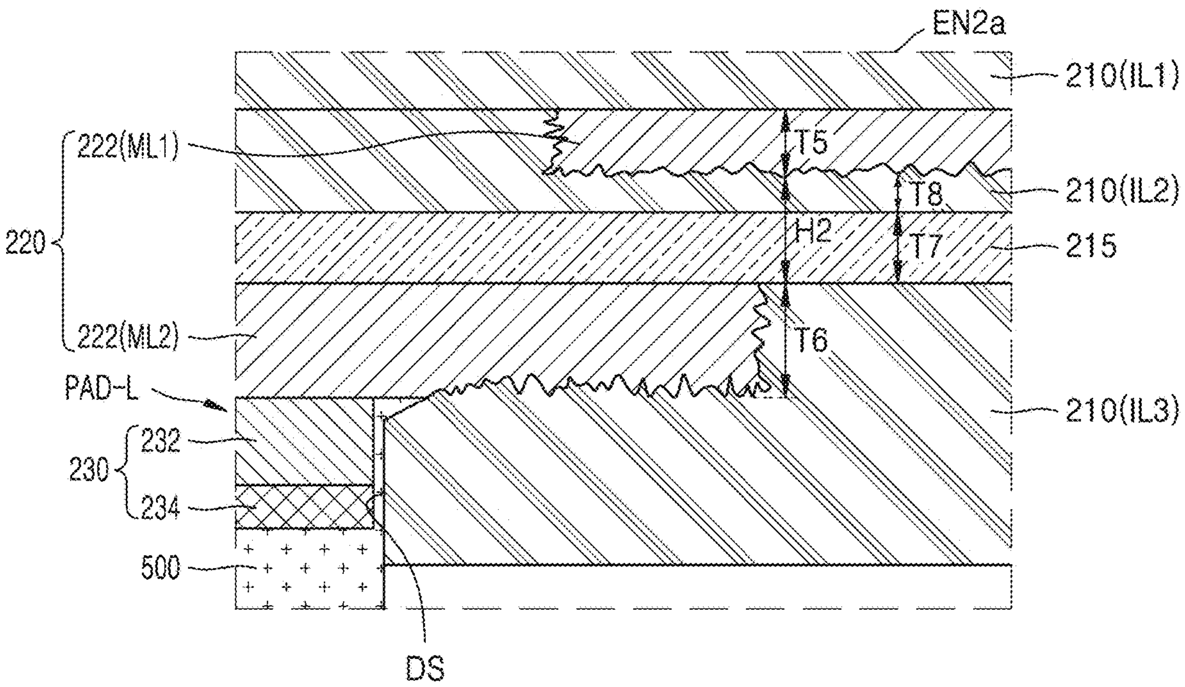

FIG. 2A is a cross-sectional view of a semiconductor package according to embodiments, and FIGS. 2B and 2C are enlarged cross-sectional views thereof. FIG. 2B is an enlarged cross-sectional view of an EN2 portion of FIG. 2A, and FIG. 2C is an enlarged cross-sectional view of a portion (indicated as EN2*a*) corresponding to the EN2 portion of FIG. 2A. In FIGS. 2A to 2C, the same reference numerals as those of FIGS. 1A to 1C substantially denote the same members, and redundant descriptions given above with reference to FIGS. 1A to 1C may be omitted.

Referring to FIG. 2A, a semiconductor package 2000 may be a PoP including a lower package LPa and the upper package UP attached onto the lower package LPa. The lower package LPa may include a first wiring structure 200*a*, the second wiring structure 400 on the first wiring structure 200*a*, at least one semiconductor chip 100 arranged between the first wiring structure 200*a* and the second wiring structure 400, and the expanded structure 300 arranged between the first wiring structure 200*a* and the second wiring structure 400 and surrounding the at least one semiconductor chip 100.

Compared with the first wiring structure 200 shown in FIG. 1A, the first wiring structure 200*a* may further include a lower crack prevention layer 215. First pad portions may be portions of the lowermost first redistribution line patterns 222. The lower crack prevention layer 215 may cover upper surfaces of the lowermost first redistribution line patterns 222. For example, the lower crack prevention layer 215 may cover all portions of the upper surfaces of the lowermost first redistribution line patterns 222, to which the first redistribution vias 224 are not connected. The lower crack prevention layer 215 may completely cover an upper surface of the first redistribution insulating layer 210 arranged at upper sides of the lowermost first redistribution line patterns 222 among the plurality of first redistribution line patterns 222. For example, an upper surface of the lower crack prevention layer 215 may be in contact with a lower surface of the first redistribution insulating layer 210 arranged at the upper sides of the lowermost first redistribution line patterns 222. The first redistribution vias 224 connected with the lowermost first redistribution line patterns 222 may penetrate the lower crack prevention layer 215 and the first redistribution insulating layer 210 arranged at the upper sides of the lowermost first redistribution line patterns 222.

Referring to FIGS. 2A to 2C together, the first wiring structure 200 may include a plurality of first redistribution insulating layers 210 that are stacked. For example, FIG. 2B may be a cross-sectional view taken along a region where the first redistribution via 224 is arranged, and FIG. 2C may be a cross-sectional view taken along a region where the first redistribution via 224 is not arranged. In some embodiments, some of the plurality of lower surface connection pads PAD-L may each be a dummy pad to which the first redistribution via 224 is not connected, and FIG. 2C may be a cross-sectional view taken along the dummy pad among the plurality of lower surface connection pads PAD-L.

For example, the plurality of first redistribution insulating layers 210 may include the first insulating layer IL1, the second insulating layer IL2, and the third insulating layer IL3, which are sequentially stacked from a lower surface of the expanded structure 300. The plurality of first redistribution line patterns 222 may include the first wiring layer ML1 arranged on a lower surface of the first insulating layer IL1 and the second wiring layer ML2 arranged on a lower surface of the second insulating layer IL2. The first insulating layer IL1, the second insulating layer IL2, the third insulating layer IL3, the first wiring layer ML1, and the second wiring layer ML2 may be respectively referred to as a first lower insulating layer, a second lower insulating layer, a third lower insulating layer, a first lower wiring layer, and a second lower wiring layer. In some embodiments, lower surfaces and side surfaces of the first wiring layer ML1 and the second wiring layer ML2, that is, the plurality of first redistribution line patterns 222, may have roughness, and upper surfaces thereof may be relatively flat. For example, after the first redistribution line pattern 222 is formed, a lower surface and side surface of the first redistribution line pattern 222 are subjected to a surface treatment process to have roughness. The roughness of the lower surface and side surface of the first redistribution line pattern 222 may improve adhesion between the first redistribution line pattern 222 and the first redistribution insulating layer 210 covering the lower surface and side surface of the first redistribution line pattern 222.

Each of the plurality of lower surface connection pads PAD-L may include a portion of the first wiring layer ML1 and the lower surface connection pad layer 230 covering a lower surface of the portion of the first wiring layer ML1. The portion of the first wiring layer ML1 included in the lower surface connection pad PAD-L may be referred to as a first pad portion. The external connection terminal 500 may be attached to the lower surface connection pad layer 230. A lower surface of the lower surface connection pad layer 230, that is, a lower surface of the second lower surface metal layer 234, may be located at a vertical level higher than that of a lower surface of the lowermost first redistribution insulating layer 210, for example, the third insulating layer IL3. For example, the lower surface connection pad layer 230 may be arranged to be recessed into the third insulating layer IL3.

In some embodiments, since delamination occurs between the first redistribution insulating layer 210, for example, the third insulating layer IL3, and the lower surface connection pad layer 230, the delamination space DS may be defined between a side surface of the third insulating layer IL3 and a side surface of the lower surface connection pad layer 230. The external connection terminal 500 may cover the lower surface of the lower surface connection pad layer 230 and fill at least a portion of the delamination space DS. For example, the external connection terminal 500 may extend from the lower surface of the lower surface connection pad layer 230 into the delamination space DS while covering the side surface of the third insulating layer IL3 and the side surface of the lower surface connection pad layer 230, and thus, may cover a portion of a lower surface of the first pad portion of the second wiring layer ML2.

The lower crack prevention layer 215 may cover an upper surface of the second wiring layer ML2. For example, the lower crack prevention layer 215 may cover all portions of the upper surface of the second wiring layer ML2, to which the first redistribution via 224 is not connected. The lower crack prevention layer 215 may completely cover the lower surface of the second insulating layer IL2. For example, the upper surface of the lower crack prevention layer 215 may be in contact with the lower surface of the second insulating layer IL2. The first redistribution via 224 connected with the second wiring layer ML2 may be connected with the first wiring layer ML1 through the lower crack prevention layer 215 and the second insulating layer IL2. The third insulating layer IL3 may cover the lower crack prevention layer 215 and the second wiring layer ML2. For example, the third insulating layer IL3 may cover a lower surface of the lower crack prevention layer 215 and a lower surface and side surface of the second wiring layer ML2. The lower crack prevention layer 215 may include a material having a modulus lower than that of the first redistribution insulating layer 210, or a material having a fracture toughness higher than that of the first redistribution insulating layer 210. For example, the lower crack prevention layer 215 may include an organic material such as PDMS having a modulus lower than that of the first redistribution insulating layer 210, or may include an inorganic material such as silicon oxide or silicon nitride having a fracture toughness higher than that of the second redistribution insulating layer 410.

The first wiring layer ML1 may have a fifth thickness T5, and the second wiring layer ML2 may have a sixth thickness T6. In some embodiments, the sixth thickness T6 may be greater than the fifth thickness T5. For example, the fifth thickness T5 may be about 4 μm to about 8 μm, and the sixth thickness T6 may be about 6 μm to about 15 μm. The lower crack prevention layer 215 may have a seventh thickness T7, and the second insulating layer IL2 on a lower surface of the first wiring layer ML1 may have an eighth thickness T8. The eighth thickness T8 may be a thickness of a portion of the second insulating layer IL2 arranged between the lower surface of the first wiring layer ML1 and the upper surface of the lower crack prevention layer 215. The lower surface of the first wiring layer ML1 may be located at a second height H2 from the upper surface of the second wiring layer ML2. The seventh thickness T7 may be equal to or greater than the fifth thickness T5. For example, the seventh thickness T7 may be about 4 μm to about 10 μm. The eighth thickness T8 may be smaller than each of the fifth thickness T5 and the seventh thickness T7. For example, the eighth thickness T8 may be about 2 μm to about 6 μm. The second height H2 may be the sum of the seventh thickness T7 and the eighth thickness T8. For example, the second height H2 may be about 6 μm to about 12 μm.

Since the semiconductor package 2000 according to embodiments of inventive concepts includes the lower crack prevention layer 215 and the upper crack prevention layer 415, an open defect may be limited and/or prevented from occurring in the first wiring layer ML1 of each of the first wiring structure 200 and the second wiring structure 400, such that electrical reliability may be ensured.

Figure 3:
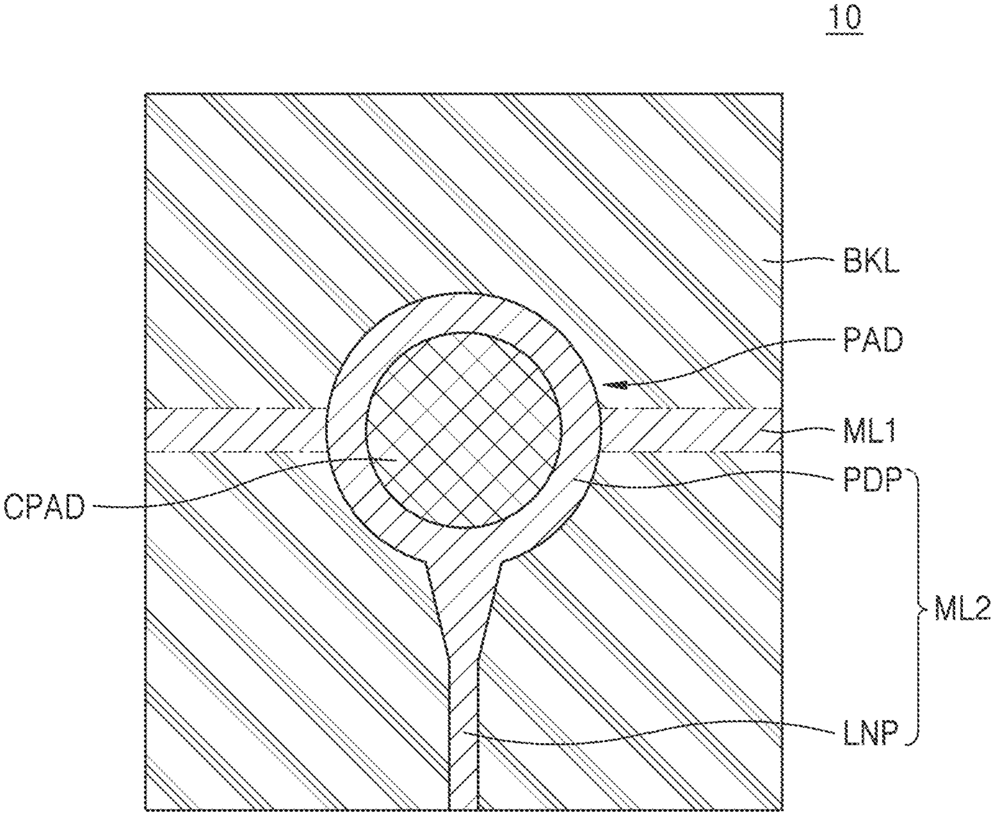
FIG. 3 is a plan layout diagram illustrating a portion of a semiconductor package according to embodiments.

FIG. 3 is a plan layout diagram illustrating a portion of a semiconductor package according to embodiments.

Referring to FIG. 3, a semiconductor package 10 includes a crack prevention layer BKL arranged on the first wiring layer ML1, the second wiring layer ML2 arranged on the crack prevention layer BKL, and a connection pad layer CPAD arranged on the second wiring layer ML2. The semiconductor package 10 may be the semiconductor package 1000 shown in FIGS. 1A to 1C or the semiconductor package 2000 shown in FIGS. 2A to 2C. The first wiring layer ML1 may be the first wiring layer ML1 among the plurality of second redistribution line patterns 422 shown in FIGS. 1A to 1C, or may be the first wiring layer ML1 among the plurality of first redistribution line patterns 222 shown in FIGS. 2A to 2C. The second wiring layer ML2 may be the second wiring layer ML2 among the plurality of second redistribution line patterns 422 shown in FIGS. 1A to 1C, or may be the second wiring layer ML2 among the plurality of first redistribution line patterns 222 shown in FIGS. 2A to 2C. The connection pad layer CPAD may be the upper surface connection pad layer 430 shown in FIGS. 1A to 1C, or may be the lower surface connection pad layer 230 shown in FIGS. 2A to 2C. The crack prevention layer BKL may be the upper crack prevention layer 415 shown in FIGS. 1A to 1C, or may be the lower crack prevention layer 215 shown in FIGS. 2A to 2C.

The second wiring layer ML2 may include a pad portion PDP and a line portion LNP extending from the pad portion PDP. The pad portion PDP may be the first pad portion or the second pad portion described with reference to FIGS. 1A to 1C and FIGS. 2A to 2C. The pad portion PDP may have a circular, elliptical, or polygonal planar shape. The line portion LNP may have a line shape extending from the pad portion PDP.

The crack prevention layer BKL may be arranged between the first wiring layer ML1 and the second wiring layer ML2. The crack prevention layer BKL may be arranged not only between the pad portion PDP of the second wiring layer ML2 and the first wiring layer ML1, but also between the line portion LNP of the second wiring layer ML2 and the first wiring layer ML1, and may extend from between the first wiring layer ML1 and the second wiring layer ML2 to the periphery thereof in the horizontal direction.

Figure 4A:
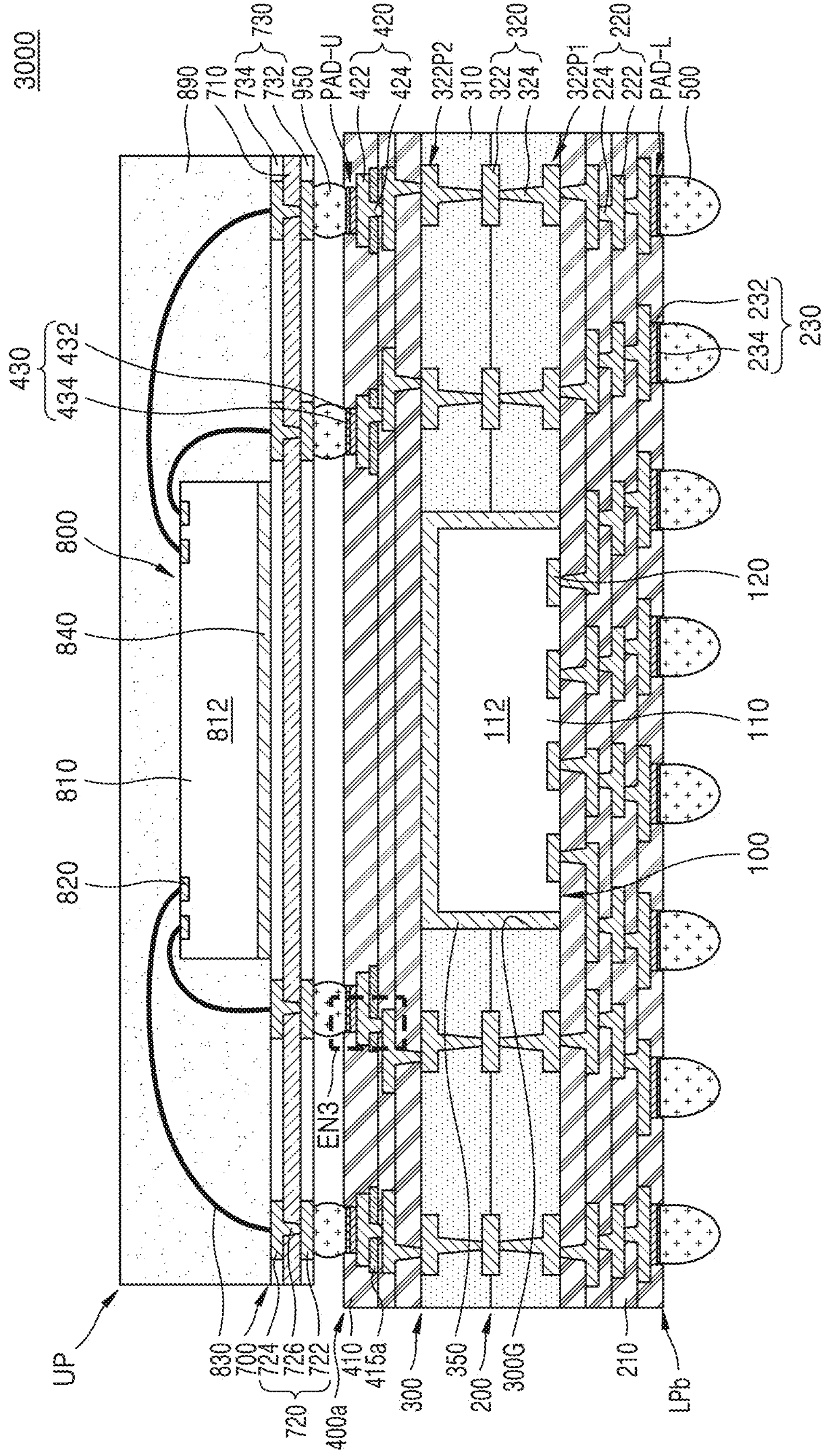
FIG. 4A is a cross-sectional view of a semiconductor package according to embodiments.
Figure 4B:
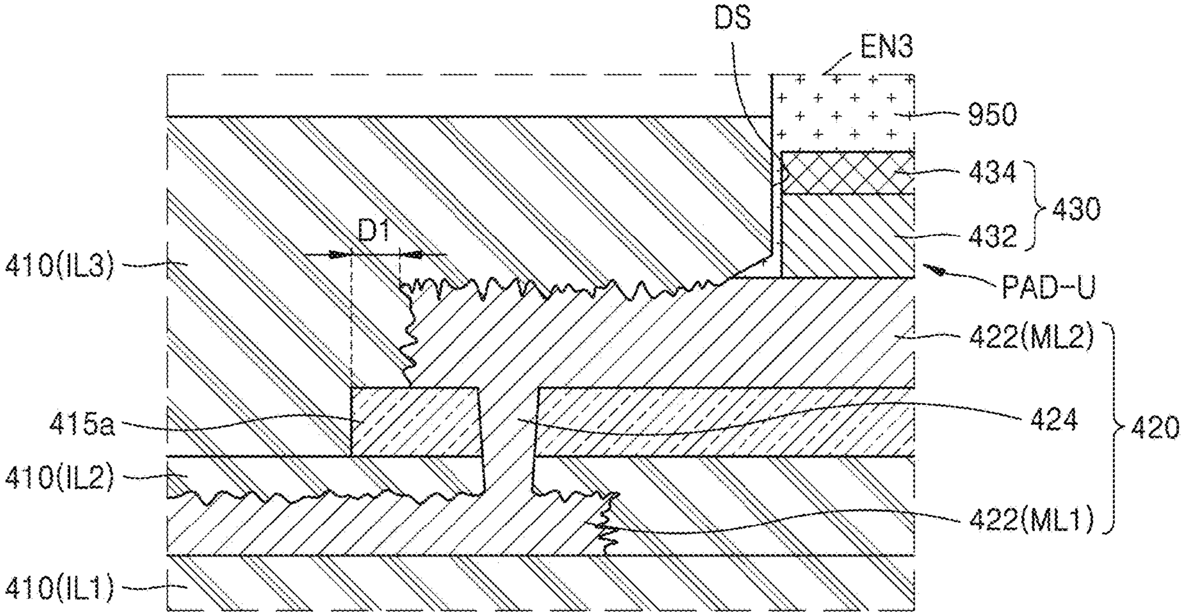
FIGS. 4B and 4C are enlarged cross-sectional views thereof.
Figure 4C:
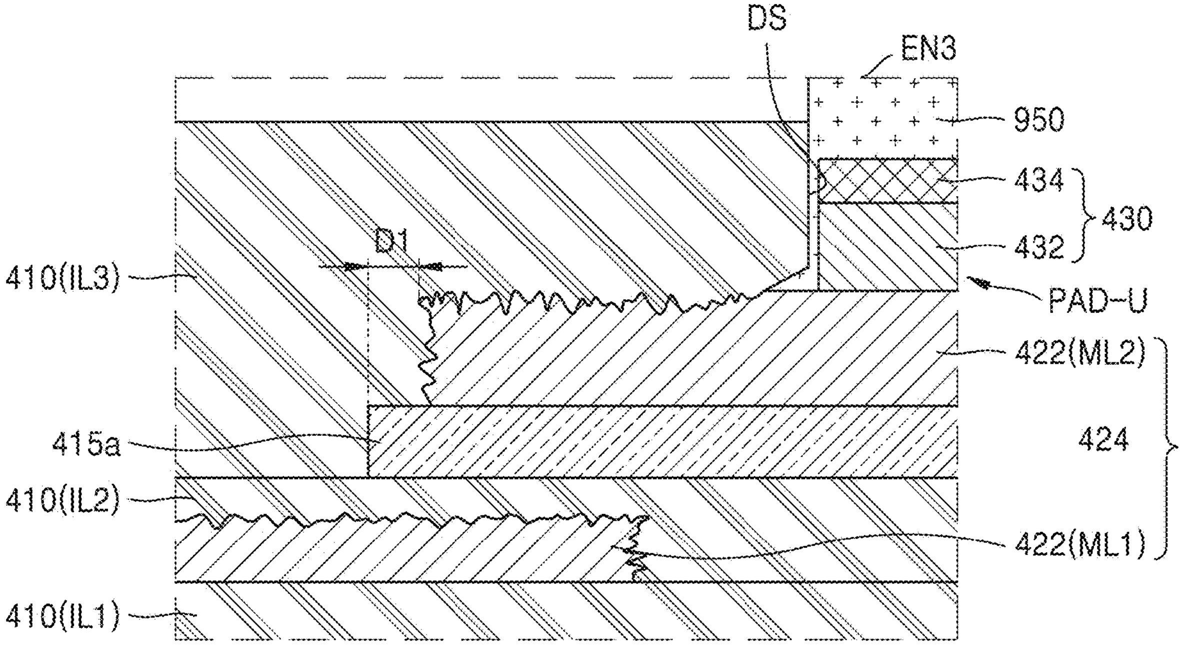

FIG. 4A is a cross-sectional view of a semiconductor package according to embodiments, and FIGS. 4B and 4C are enlarged cross-sectional views thereof. FIG. 4B is an enlarged cross-sectional view of an EN3 portion of FIG. 4A, and FIG. 4C is an enlarged cross-sectional view of a portion (indicated as EN3*a*) corresponding to the EN3 portion of FIG. 4A. In FIGS. 4A to 4C, the same reference numerals as those of FIGS. 1A to 1C substantially denote the same members, and redundant descriptions given above with reference to FIGS. 1A to 1C may be omitted.

Referring to FIGS. 4A to 4C together, a semiconductor package 3000 may be a PoP including a lower package LPb and the upper package UP attached onto the lower package LPb. The lower package LPb may include the first wiring structure 200, a second wiring structure 400*a* on the first wiring structure 200, at least one semiconductor chip 100 arranged between the first wiring structure 200 and the second wiring structure 400*a*, and the expanded structure 300 arranged between the first wiring structure 200 and the second wiring structure 400*a* and surrounding the at least one semiconductor chip 100. Instead of the upper crack prevention layer 415 included in the second wiring structure 400 shown in FIG. 1A, the second wiring structure 400*a* may include upper crack prevention layers 415*a* apart from each other. The upper crack prevention layer 415*a* may include a material having a modulus lower than that of the second redistribution insulating layer 410, or a material having a fracture toughness higher than that of the second redistribution insulating layer 410.

Second pad portions may be portions of the uppermost second redistribution line patterns 422. The upper crack prevention layers 415*a* may cover the portions of the uppermost second redistribution line patterns 422, that is, lower surfaces of the second pad portions. For example, the upper crack prevention layers 415*a* may cover all portions of the lower surfaces of the second pad portions, to which the second redistribution vias 424 are not connected. The upper crack prevention layers 415*a* may cover only portions of an upper surface of the second redistribution insulating layer 410 arranged at lower sides of the second pad portions and portions adjacent thereto, and may not cover other portions of the upper surface of the second redistribution insulating layer 410. For example, a lower surface of the upper crack prevention layer 415*a* may be in contact with the upper surface of the second redistribution insulating layer 410 arranged at lower sides of the uppermost second redistribution line patterns 422. The second redistribution vias 424 connected with the second pad portions may penetrate the upper crack prevention layer 415*a* and the second redistribution insulating layer 410 arranged at the lower sides of the second pad portions.

The upper crack prevention layer 415*a* may be arranged to cover a lower surface of the second pad portion of the second wiring layer ML2 and further extend from an edge of the second pad portion to the outside in the horizontal direction. An edge of the upper crack prevention layer 415*a* may be apart from the edge of the second pad portion of the second wiring layer ML2 by a first distance D1 in the horizontal direction. For example, the upper crack prevention layer 415*a* may extend from the edge of the second pad portion of the second wiring layer ML2 to the outside by the first distance D1 in the horizontal direction. For example, the first distance D1 may be about 5 μm to about 10 μm.

Figure 5A:
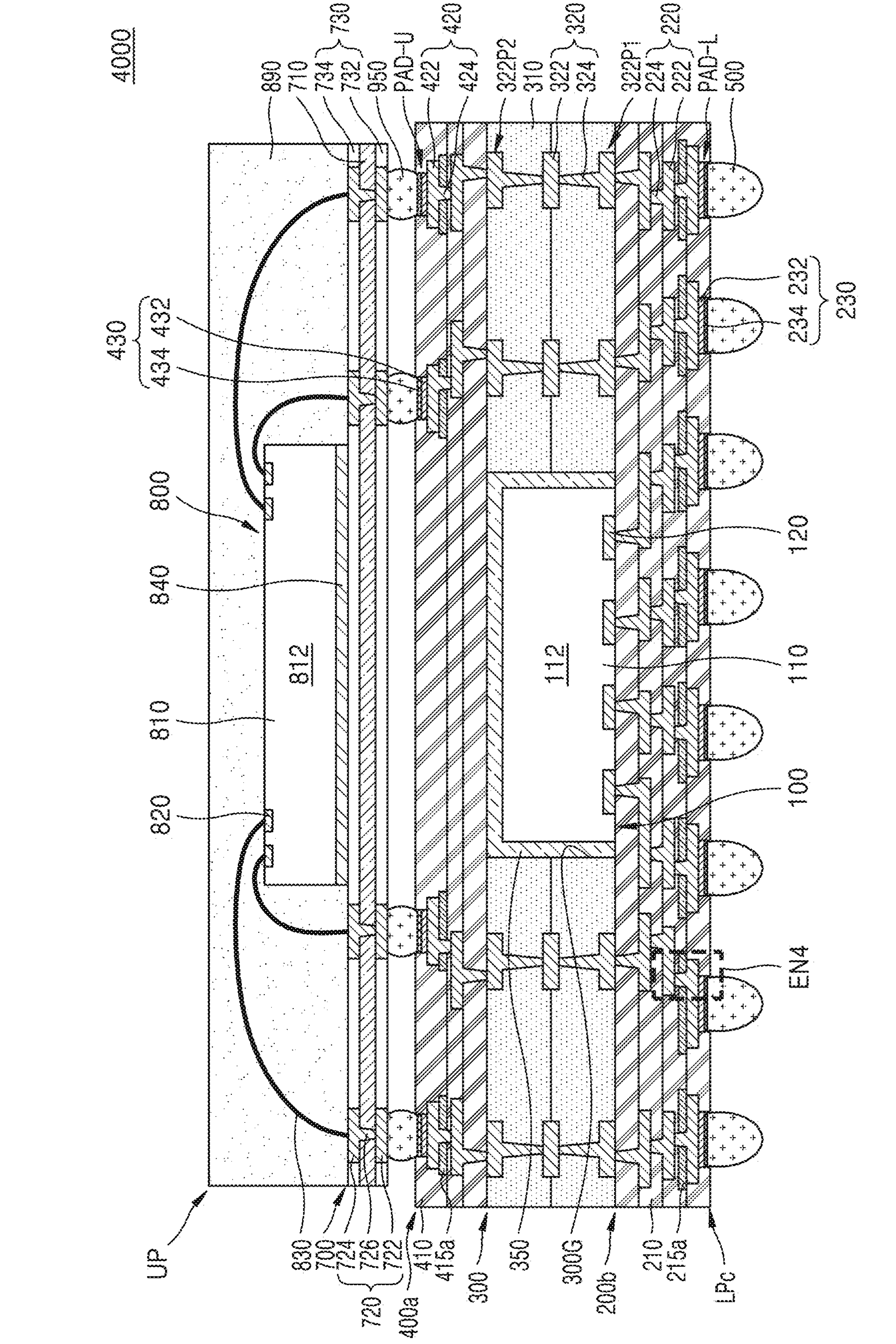
FIG. 5A is a cross-sectional view of a semiconductor package according to embodiments.
Figure 5B:
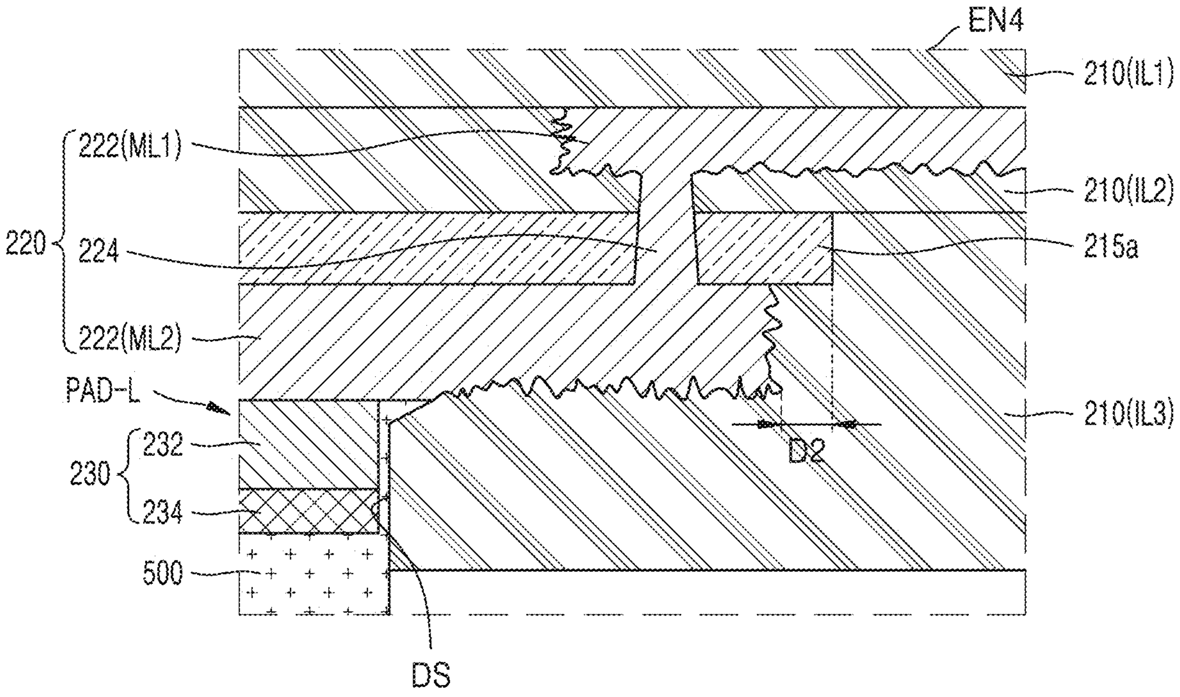
FIGS. 5B and 5C are enlarged cross-sectional views thereof.
Figure 5C:
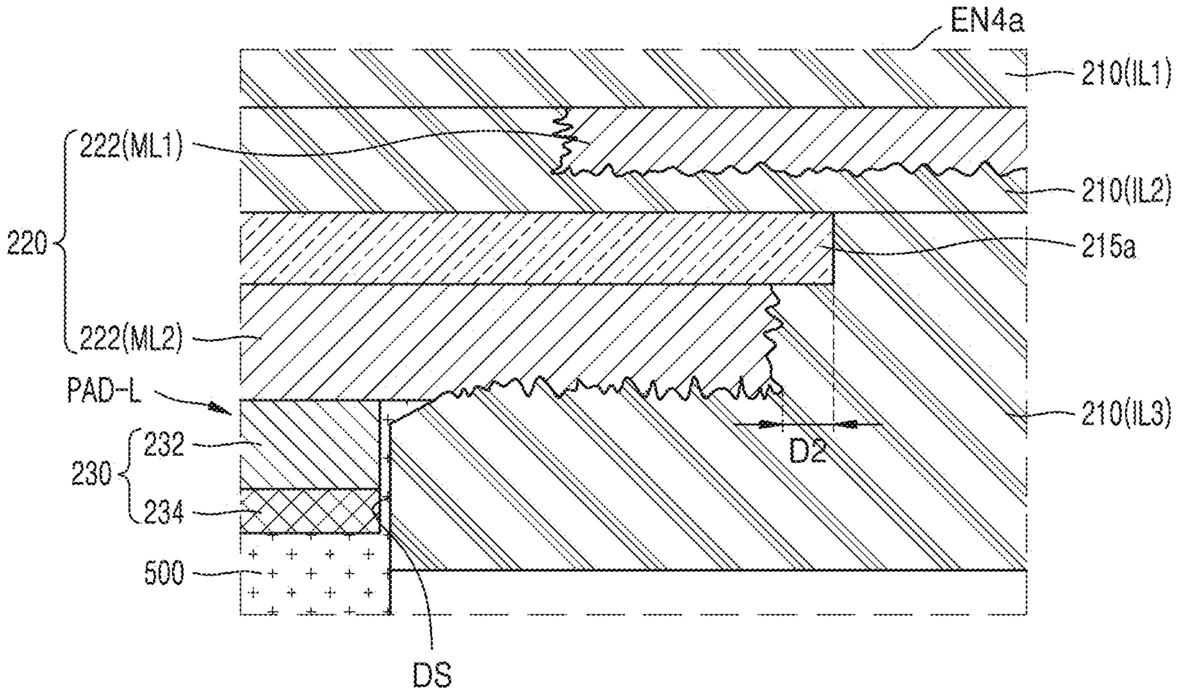

FIG. 5A is a cross-sectional view of a semiconductor package according to embodiments, and FIGS. 5B and 5C are enlarged cross-sectional views thereof. FIG. 5B is an enlarged cross-sectional view of an EN4 portion of FIG. 5A, and FIG. 5C is an enlarged cross-sectional view of a portion (indicated as EN4*a*) corresponding to the EN4 portion of FIG. 5A. In FIGS. 5A to 5C, the same reference numerals as those of FIGS. 3A to 3C substantially denote the same members, and redundant descriptions given above with reference to FIGS. 3A to 3C may be omitted.

Referring to FIGS. 5A to 5C together, a semiconductor package 4000 may be a PoP including the lower package LPb and the upper package UP attached onto the lower package LPb. The lower package LPb may include a first wiring structure 200*b*, the second wiring structure 400*a* on the first wiring structure 200*b*, at least one semiconductor chip 100 arranged between the first wiring structure 200*b* and the second wiring structure 400*a*, and the expanded structure 300 arranged between the first wiring structure 200*b* and the second wiring structure 400*a* and surrounding the at least one semiconductor chip 100.

Compared with the first wiring structure 200 shown in FIGS. 3A to 3C, the first wiring structure 200*b* may further include a lower crack prevention layer 215*a*. The lower crack prevention layer 215*a* may include a material having a modulus lower than that of the first redistribution insulating layer 210, or a material having a fracture toughness higher than that of the first redistribution insulating layer 210.

First pad portions may be portions of the lowermost first redistribution line patterns 222. The upper crack prevention layers 215*a* may cover the portions of the lowermost first redistribution line patterns 222, that is, upper surfaces of the first pad portions. For example, the lower crack prevention layers 215*a* may cover all portions of the upper surfaces of the first pad portions, to which the first redistribution vias 224 are not connected. The lower crack prevention layer 215*a* may cover only portions of a lower surface of the first redistribution insulating layer 210 arranged at upper sides of the first pad portions and portions adjacent thereto, and may not cover other portions of the lower surface of the first redistribution insulating layer 210. For example, an upper surface of the lower crack prevention layer 215*a* may be in contact with an upper surface of the first redistribution insulating layer 210 arranged at upper sides of the lowermost first redistribution line patterns 222 The first redistribution vias 224 connected with the first pad portions may penetrate the lower crack prevention layer 215*a* and the first redistribution insulating layer 210 arranged at the upper sides of the first pad portions.

The lower crack prevention layer 215*a* may be arranged to cover an upper surface of the first pad portion of the first wiring layer ML1 and further extend from an edge of the first pad portion to the outside in the horizontal direction. An edge of the lower crack prevention layer 215*a* may be apart from the edge of the first pad portion of the first wiring layer ML1 by a second distance D2 in the horizontal direction. For example, the lower crack prevention layer 215*a* may extend from the edge of the first pad portion of the first wiring layer ML1 to the outside by the second distance D2 in the horizontal direction. For example, the second distance D2 may be about 5 μm to about 10 μm. In some embodiments, the second distance D2 may be substantially equal to the first distance D1 of FIGS. 4B and 4C.

Figure 6A:
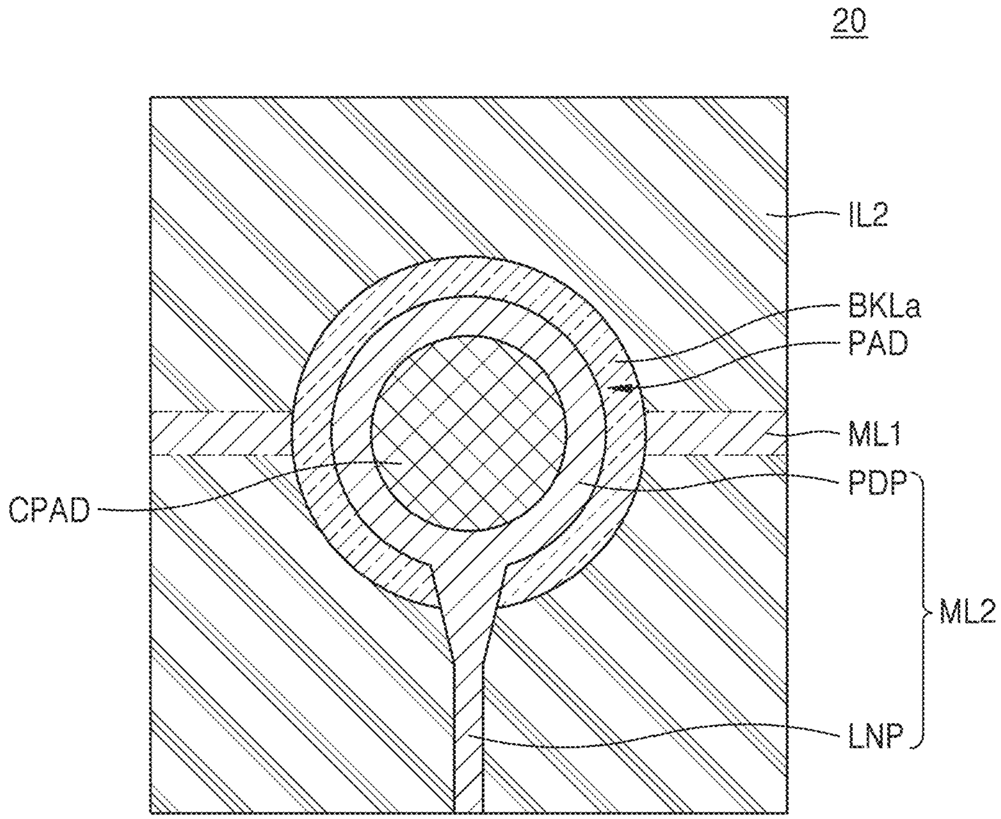
FIGS. 6A and 6B are plan layout diagrams illustrating portions of semiconductor packages according to embodiments.
Figure 6B:
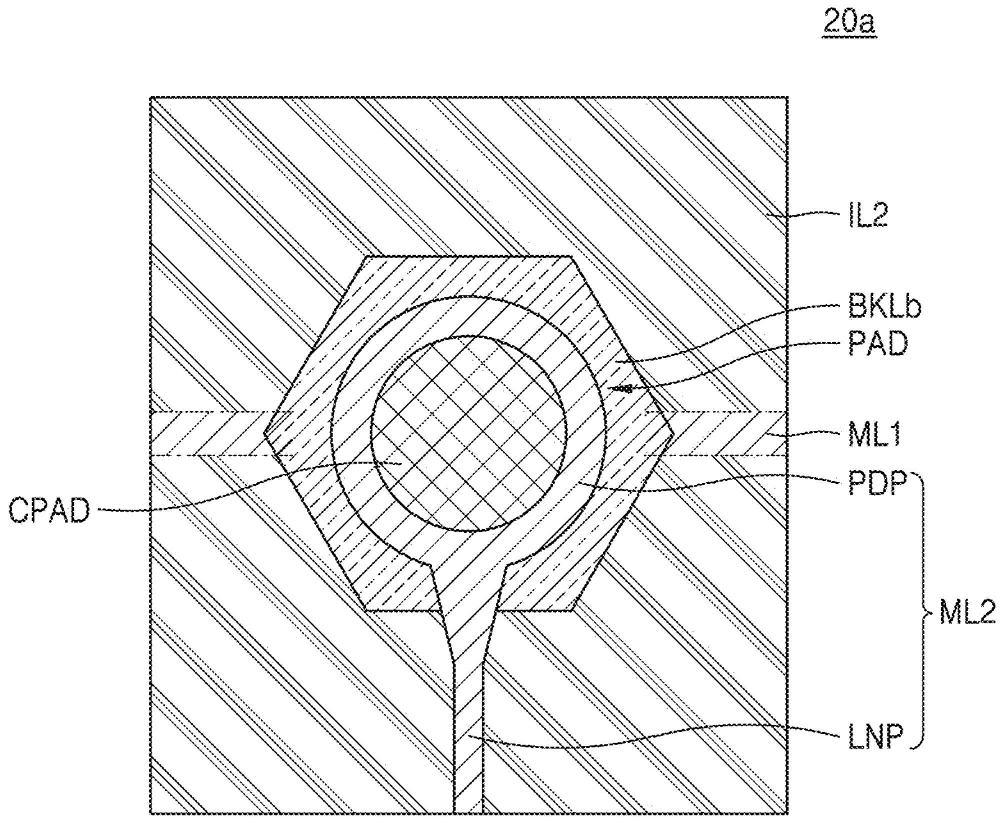

FIGS. 6A and 6B are plan layout diagrams illustrating portions of semiconductor packages according to embodiments.

Referring to FIG. 6A, a semiconductor package 20 includes a crack prevention layer BKLa arranged on the first wiring layer ML1, the second wiring layer ML2 arranged on the crack prevention layer BKLa, and the connection pad layer CPAD arranged on the second wiring layer ML2. The semiconductor package 20 may be the semiconductor package 3000 shown in FIGS. 4A to 4C or the semiconductor package 4000 shown in FIGS. 5A to 5C. The crack prevention layer BKLa may be the upper crack prevention layer 415*a* shown in FIGS. 4A to 4C, or may be the lower crack prevention layer 215*a* shown in FIGS. 5A to 5C. The crack prevention layer BKLa may have a circular or an elliptical planar shape.

The crack prevention layer BKLa may be arranged between the first wiring layer ML1 and the second wiring layer ML2. The crack prevention layer BKLa may extend from between the pad portion PDP of the second wiring layer ML2 and the first wiring layer ML1 to the outside by the first distance D1 shown in FIGS. 4B and 4C or the second distance D2 shown in FIGS. 5B and 5C in the horizontal direction. The crack prevention layer BKLa may cover only the pad portion PDP and portions of the second insulating layer IL2 overlapping a portion adjacent to the pad portion PDP in the vertical direction, and may not cover other portions of the second insulating layer IL2.

Referring to FIG. 6B, a semiconductor package 20*a* includes a crack prevention layer BKLb arranged on the first wiring layer ML1, the second wiring layer ML2 arranged on the crack prevention layer BKLb, and the connection pad layer CPAD arranged on the second wiring layer ML2. The semiconductor package 20*a* may be the semiconductor package 3000 shown in FIGS. 4A to 4C or the semiconductor package 4000 shown in FIGS. 5A to 5C. The crack prevention layer BKLb may be the upper crack prevention layer 415*a* shown in FIGS. 4A to 4C, or may be the lower crack prevention layer 215*a* shown in FIGS. 5A to 5C. The crack prevention layer BKLb may have a polygonal planar shape. FIG. 6B illustrates that the crack prevention layer BKLb has hexagonal planar shape, but this is only an example, and inventive concepts are not limited thereto. For example, the crack prevention layer BKLb may have a planar shape of a quadrangle, a pentagon, a heptagon, an octagon, or another polygon with more sides.

Figure 7A:
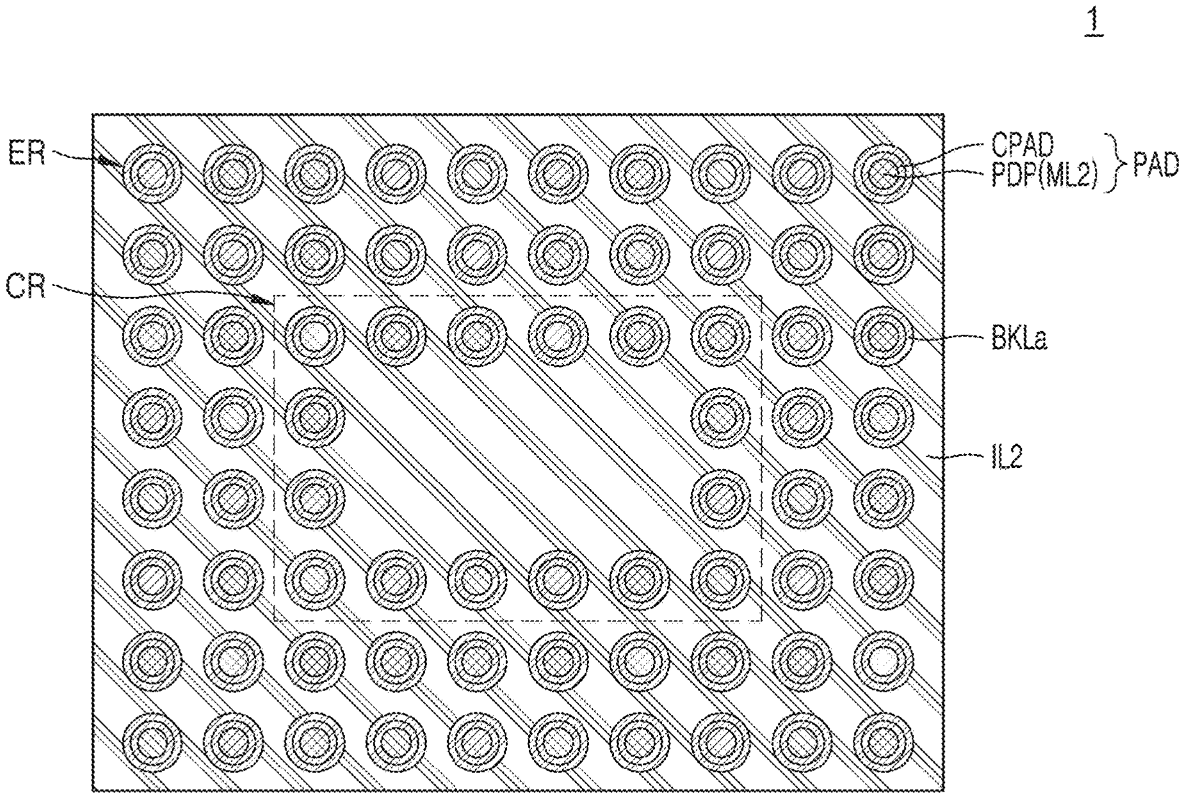
FIGS. 7A to 7C are plan layout diagrams of semiconductor packages according to embodiments.
Figure 7B:
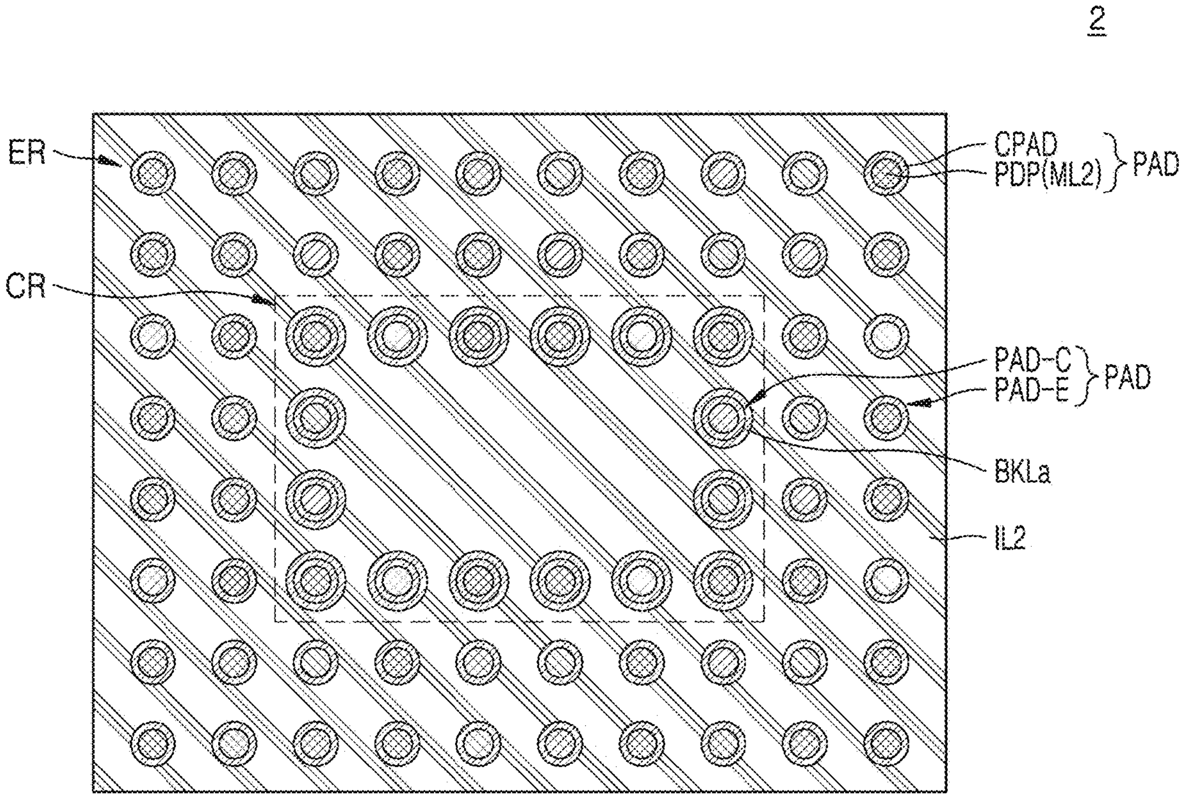
Figure 7C:
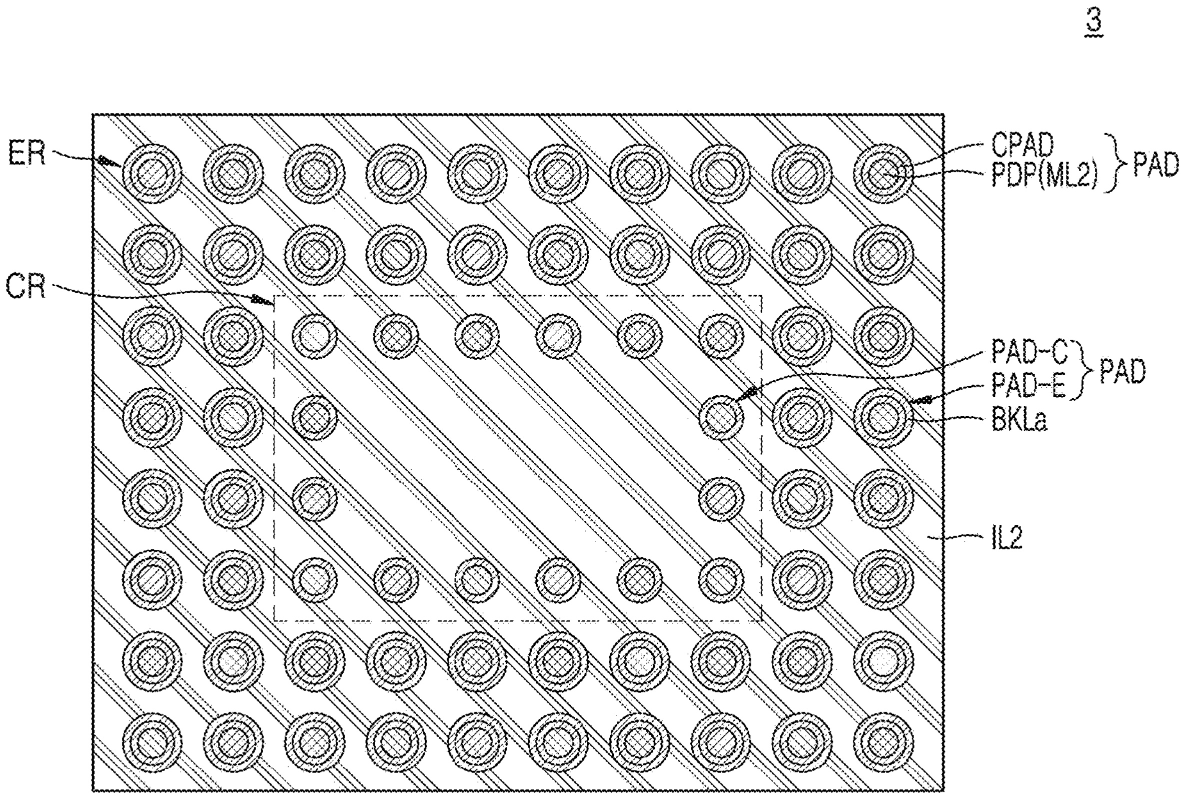

FIGS. 7A to 7C are plan layout diagrams of semiconductor packages according to embodiments.

Referring to FIG. 7A, a semiconductor package 1 includes a plurality of connection pads PAD. The semiconductor package 1 may be one of the semiconductor package 3000 shown in FIGS. 4A to 4C and the semiconductor package 4000 shown in FIGS. 5A to 5C. Each of the plurality of connection pads PAD may include the pad portion PDP of the second wiring layer ML2 and the connection pad layer CPAD arranged on the pad portion PDP. The semiconductor package 1 may include a central region CR and an edge region ER surrounding the central region CR in a plan view. Some of the plurality of connection pads PAD may be arranged in the central region CR, and some other thereof may be arranged in the edge region ER. The crack prevention layer BKLa may include a portion overlapping the pad portion PDP and a portion extending from the portion overlapping the pad portion PDP to the outside in the horizontal direction. The crack prevention layers BKLa may be arranged in both the central region CR and the edge region ER. In some embodiments, the semiconductor package 1 may include the crack prevention layer BKLb shown in FIG. 6B instead of the crack prevention layer BKLa.

Referring to FIG. 7B, a semiconductor package 2 may include the plurality of connection pads PAD. The semiconductor package 2 may be one of the semiconductor package 3000 shown in FIGS. 4A to 4C and the semiconductor package 4000 shown in FIGS. 5A to 5C. The semiconductor package 2 may include the central region CR and the edge region ER surrounding the central region CR in a plan view. Some of the plurality of connection pads PAD may be arranged in the central region CR, and some other thereof may be arranged in the edge region ER. The connection pads PAD arranged in the central region CR may each be referred to as a central connection pad PAD-C, and the connection pads PAD arranged in the edge region ER may each be referred to as an edge connection pad PAD-E. The crack prevention layers BKLa may be arranged in the central region CR, but may not be arranged in the edge region ER. In other words, the crack prevention layers BKLa may overlap the central connection pads PAD-C, but may not overlap the edge connection pads PAD-E. For example, when the semiconductor package 2 is subjected to more stress in the central region CR than in the edge region ER due to bending or the like, the crack prevention layer BKLa may be arranged in the central region CR on which the stress is relatively concentrated, and the crack prevention layer BKLa may not be arranged in the edge region ER on which the stress is not relatively concentrated. In some embodiments, the semiconductor package 2 may include the crack prevention layer BKLb shown in FIG. 6B instead of the crack prevention layer BKLa.

Referring to FIG. 7C, a semiconductor package 3 may include the plurality of connection pads PAD. The semiconductor package 3 may be one of the semiconductor package 3000 shown in FIGS. 4A to 4C and the semiconductor package 4000 shown in FIGS. 5A to 5C. The semiconductor package 3 may include the central region CR and the edge region ER surrounding the central region CR in a plan view. Some of the plurality of connection pads PAD may be arranged in the central region CR, and some other thereof may be arranged in the edge region ER. The crack prevention layers BKLa may be arranged in the edge region ER, but may not be arranged in the central region CR. In other words, the crack prevention layers BKLa may overlap the edge connection pads PAD-E, but may not overlap the central connection pads PAD-C.

Figure 8A:
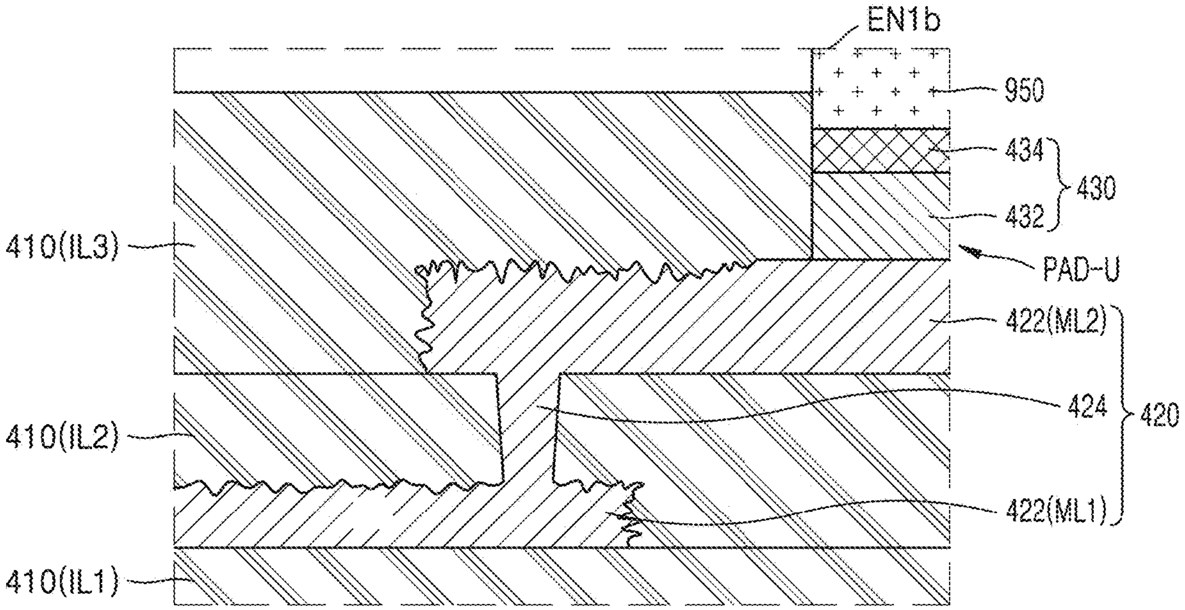
FIGS. 8A and 8B are enlarged cross-sectional views of semiconductor packages according to embodiments.
Figure 8B:
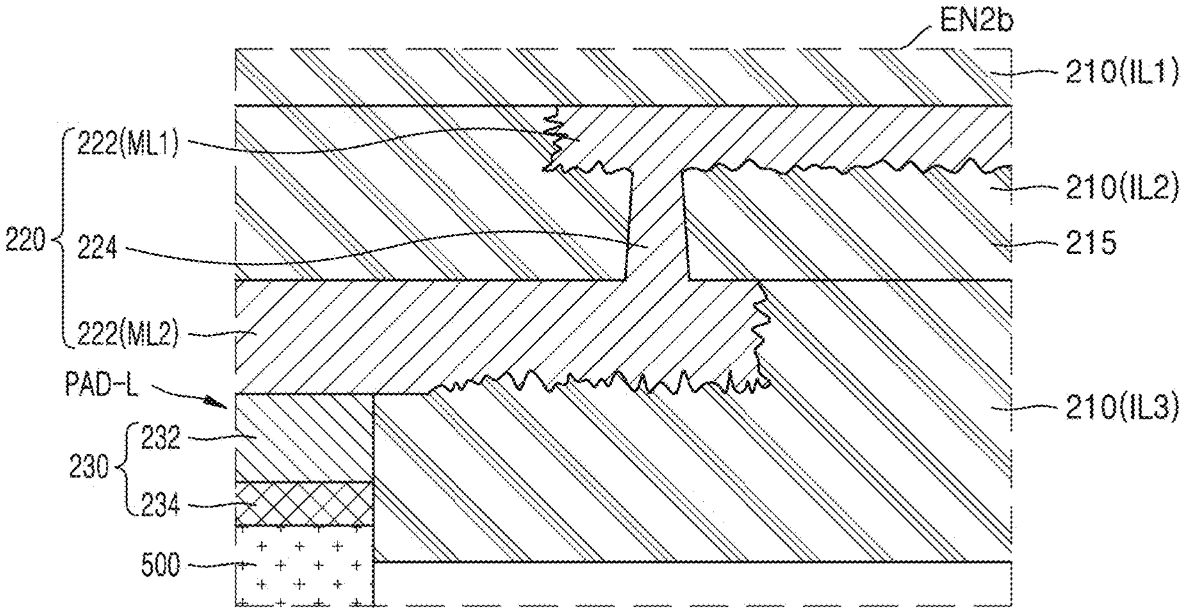

FIGS. 8A and 8B are enlarged cross-sectional views of semiconductor packages according to embodiments. FIGS. 8A and 8B are enlarged cross-sectional views illustrating a portion in which the edge connection pad PAD-E shown in FIG. 7B is arranged or a portion in which the central connection pad PAD-C shown in FIG. 7C is arranged.

Referring to FIG. 8A, a lower surface of a portion of the second wiring layer ML2 overlapping the upper surface connection pad PAD-U, on which the crack prevention layer BKLa shown in FIGS. 7B and 7C is not arranged, may be in contact with an upper surface of the second insulating layer IL2. A side surface of the third insulating layer IL3 and a side surface of the upper surface connection pad layer 430 may be in contact with each other without being apart from each other. The crack prevention layer BKLa shown in FIGS. 7B and 7C may not be arranged at a lower side of the upper surface connection pad PAD-U in which delamination does not occur between the side surface of the third insulating layer IL3 and the side surface of the upper surface connection pad layer 430.

Referring to FIG. 8B, an upper surface of a portion of the second wiring layer ML2 overlapping the lower surface connection pad PAD-L, on which the crack prevention layer BKLa shown in FIGS. 7B and 7C is not arranged, may be in contact with a lower surface of the second insulating layer IL2. A side surface of the third insulating layer IL3 and a side surface of the lower surface connection pad layer 230 may be in contact with each other without being apart from each other. The crack prevention layer BKLa shown in FIGS. 7B and 7C may not be arranged on the lower surface connection pad PAD-L in which delamination does not occur between the side surface of the third insulating layer IL3 and the side surface of the lower surface connection pad layer 230.

FIGS. 9A to 9E are cross-sectional views illustrating a method of manufacturing a semiconductor package, according to embodiments. FIGS. 9A to 9E are cross-sectional views illustrating a portion corresponding to EN1 of FIG. 1A.

Figure 9A:
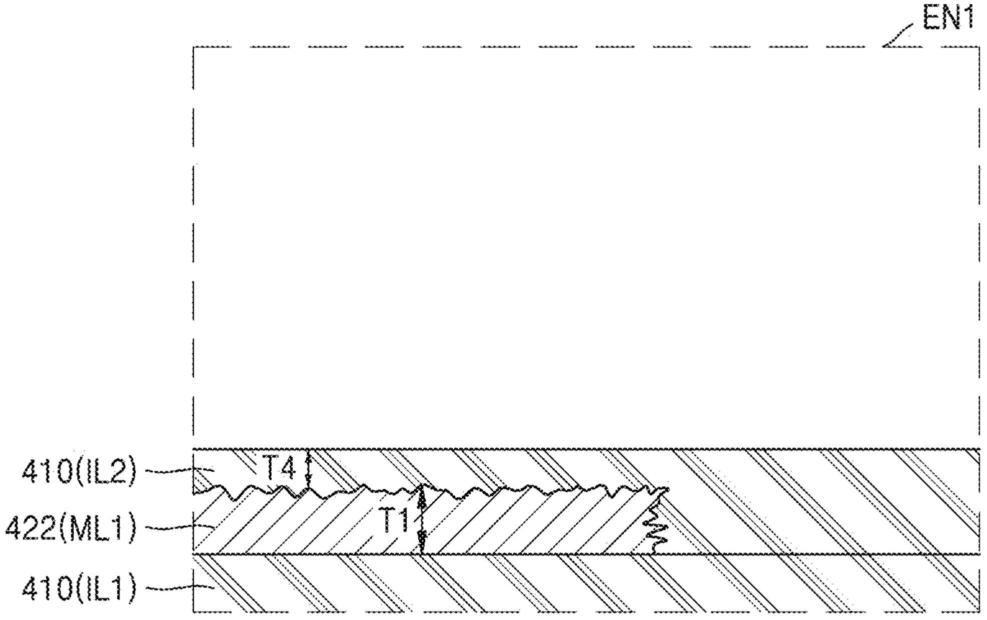
FIGS. 9A to 9E are cross-sectional views illustrating a method of manufacturing a semiconductor package, according to embodiments.

Referring to FIGS. 1A and 9A, after the expanded structure 300 and the first wiring structure 200 are formed, the second redistribution insulating layer 410 and the second redistribution pattern 420 including the second redistribution line pattern 422 are sequentially formed. For example, after the first insulating layer IL1 is formed, the first wiring layer ML1 is formed, and the second insulating layer IL2 covering the first insulating layer IL1 and the first wiring layer ML1 is formed. After the first wiring layer ML1 is formed and before the second insulating layer IL2 is formed, a surface treatment process is performed on an upper surface and side surface of the first wiring layer ML1, such that the upper surface and side surface of the first wiring layer ML1 may be formed to have roughness. The first wiring layer ML1 may be formed to have the first thickness T1, and the second insulating layer IL2 may be formed on the first wiring layer ML1 to have the fourth thickness T4. In some embodiments, the second insulating layer IL2 may be formed to have a substantially flat upper surface.

Figure 9B:
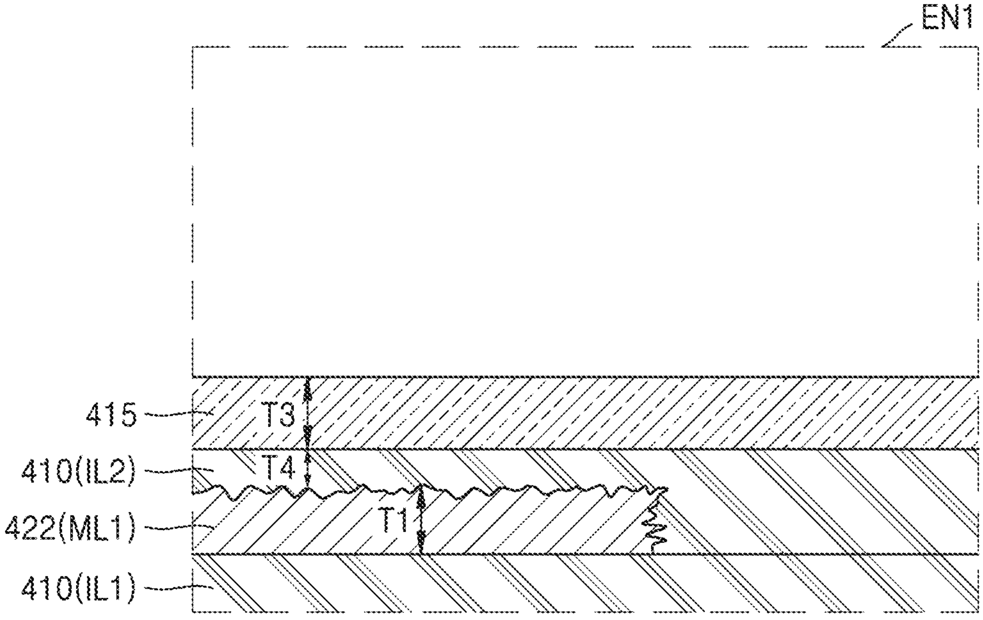

Referring to FIG. 9B, the upper crack prevention layer 415 is formed on the second insulating layer IL2. The upper crack prevention layer 415 may be formed to include a material having a modulus lower than that of the second redistribution insulating layer 410 or a material having a fracture toughness higher than that of the second redistribution insulating layer 410. The upper crack prevention layer 415 may be formed to have the third thickness T3 equal to or greater than the first thickness T1.

Figure 9C:
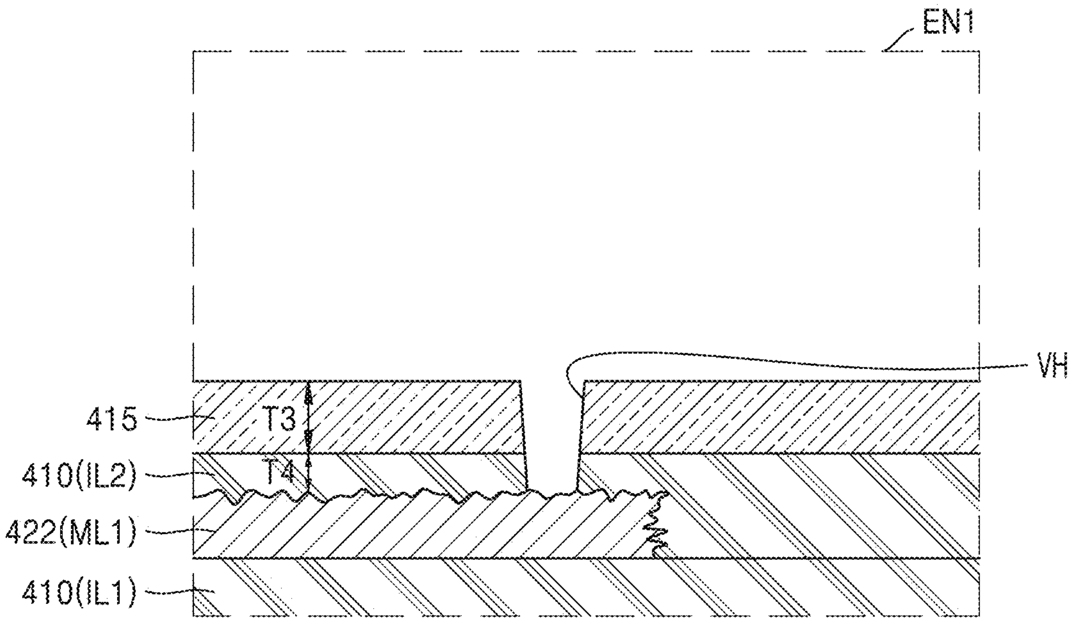

Referring to FIG. 9C, portions of the upper crack prevention layer 415 and the second insulating layer IL2 are removed to form a via hole VH through which the first wiring layer ML1 is exposed at the bottom of the via hole VH. The via hole VH may be formed to have a tapered shape that, from a lower side to an upper side, increases in horizontal width and extends.

Figure 9D:
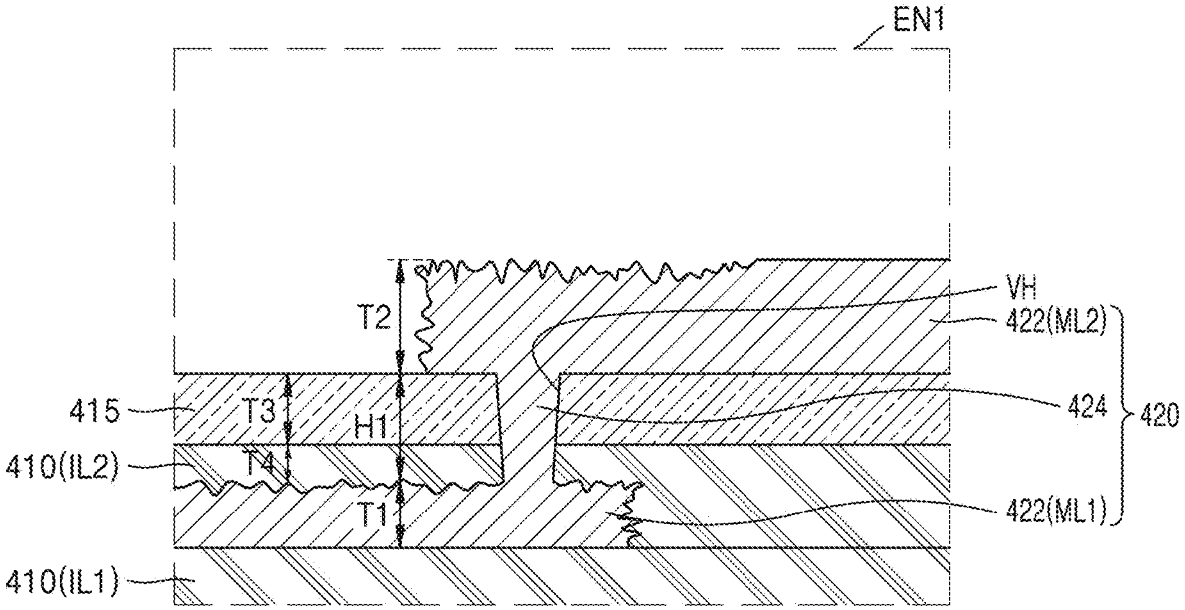

Referring to FIG. 9D, the second redistribution via 424 filling the via hole VH and connected with the first wiring layer ML1 and the second wiring layer ML2 arranged on the upper crack prevention layer 415 are formed. The second redistribution via 424 filling the via hole VH and the second wiring layer ML2 arranged on the upper crack prevention layer 415 may be formed together to form an integral body. The second redistribution via 424 may be formed to have a tapered shape that, from a lower side to an upper side, increases in horizontal width and extends. The second wiring layer ML2 may be formed on the upper crack prevention layer 415 to have the second thickness T2 greater than the first thickness T1.

Figure 9E:
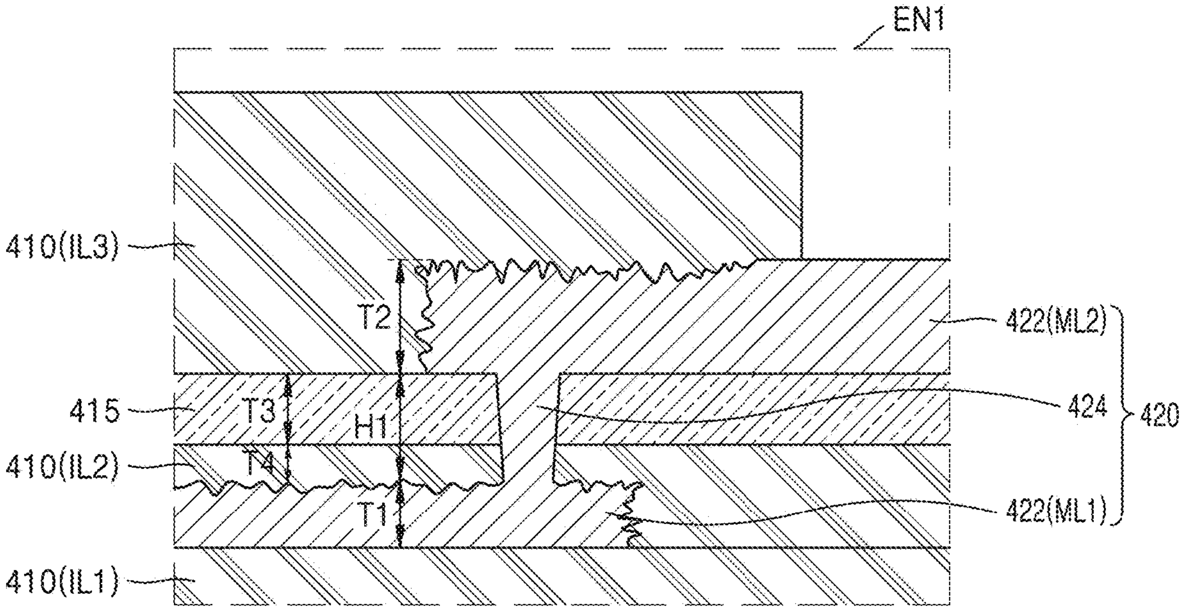

Referring to FIG. 9E, the third insulating layer IL3 covering the upper crack prevention layer 415 and a portion of the second wiring layer ML2 is formed. Afterwards, as shown in FIGS. 1A and 1B, after the upper surface connection pad PAD-U including a portion of the second wiring layer ML2 and the upper surface connection pad layer 430 is formed by forming the upper surface connection pad layer 430 in which the first upper surface metal layer 432 and the second upper surface metal layer 434 are stacked, the package connection terminal 950 may be attached onto the upper surface connection pad PAD-U to form the semiconductor package 1000 in which the upper package UP is attached onto the lower package LP. In a process for attaching the package connection terminal 950 onto the upper surface connection pad PAD-U, delamination occurs between the third insulating layer IL3 and the upper surface connection pad layer 430, and thus, the delamination space DS may be defined between a side surface of the third insulating layer IL3 and a side surface of the upper surface connection pad layer 430, and the package connection terminal 950 may be formed to cover an upper surface of the upper surface connection pad layer 430 and fill the delamination space DS.

FIGS. 10A to 10D are cross-sectional views illustrating a method of manufacturing a semiconductor package, according to embodiments. FIGS. 10A to 10D are cross-sectional views illustrating a portion corresponding to EN3 of FIG. 4A.

Figure 10A:
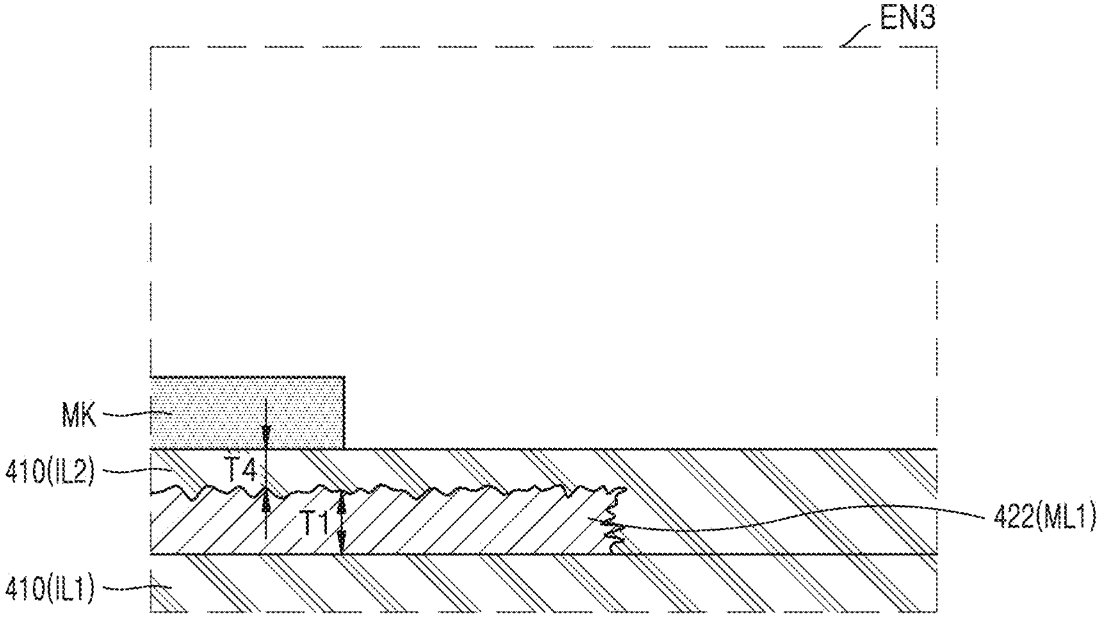
FIGS. 10A to 10D are cross-sectional views illustrating a method of manufacturing a semiconductor package, according to embodiments.

Referring to FIGS. 4A and 10A, as described above with reference to FIG. 9A, after the first insulating layer IL1, the first wiring layer ML1, and the second insulating layer IL2 are formed, a mask layer MK covering a portion of the second insulating layer IL2 is formed. For example, the mask layer MK may include a photoresist.

Figure 10B:
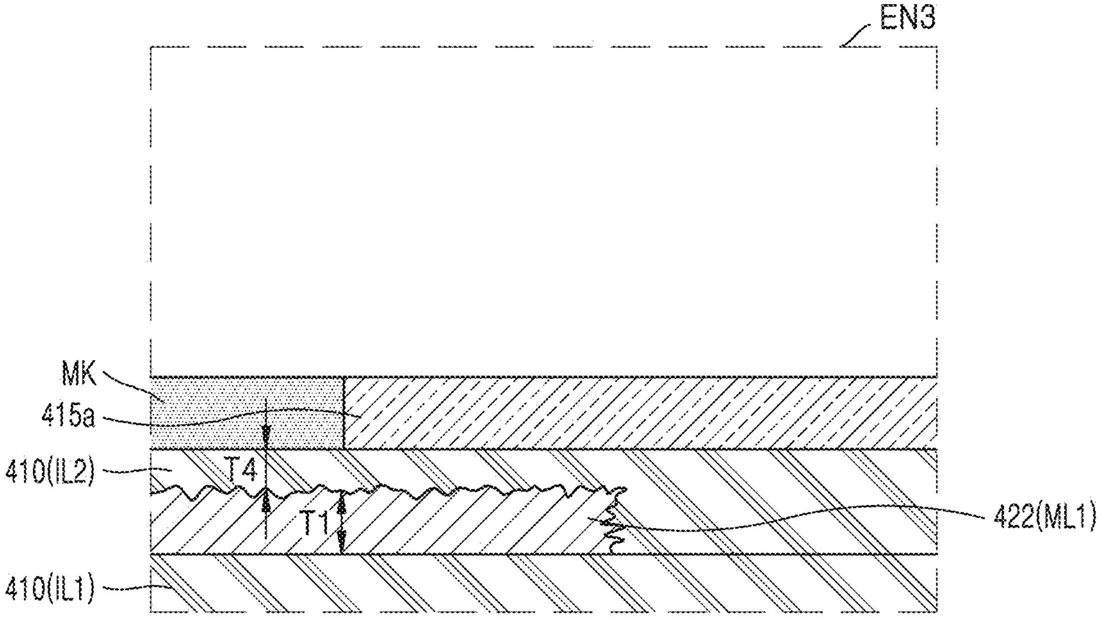

Referring to FIG. 10B, after the upper crack prevention layer **415*a* covering an upper surface of the second insulating layer IL2 not covered by the mask layer MK is formed, the mask layer MK is removed. In some embodiments, after a crack prevention material layer covering the second insulating layer IL2 and the mask layer MK is formed, a lift off process is performed to remove the mask layer MK and a portion of the crack prevention material layer covering the mask layer MK together to form the upper crack prevention layer 415*a***.

Figure 10C:
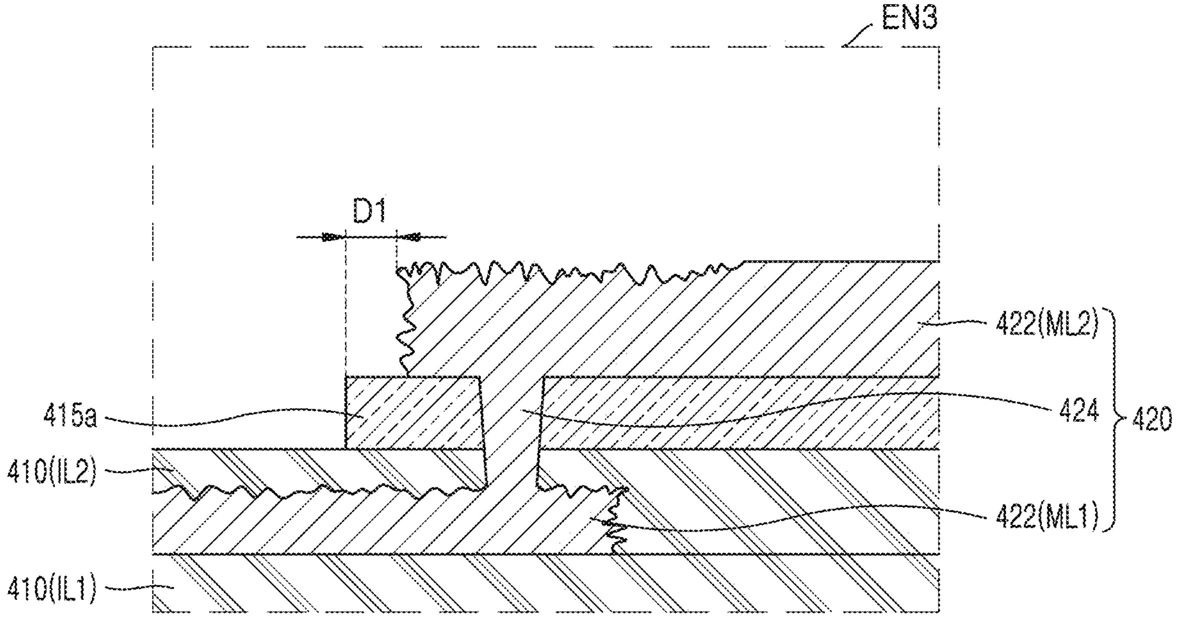

Referring to FIG. 10C, similar to the descriptions given above with reference to FIGS. 9C and 9D, portions of the upper crack prevention layer **415*a* and the second insulating layer IL2 are removed to from the via hole VH through which the first wiring layer ML1 is exposed at the bottom of the via hole VH, and the second redistribution via 424 filling the via hole VH and connected with the first wiring layer ML1 and the second wiring layer ML2 arranged on the upper crack prevention layer 415*a* are formed. The second wiring layer ML2 may be formed to cover only a portion of the upper crack prevention layer 415*a*. For example, the second wiring layer ML2 may be formed not to cover a portion of an upper surface of the upper crack prevention layer 415*a*, the portion being adjacent to an edge thereof. The second wiring layer ML2 may be formed such that an edge of the second wiring layer ML2 is apart from the edge of the upper crack prevention layer 415*a*** by the first distance D1.

Figure 10D:
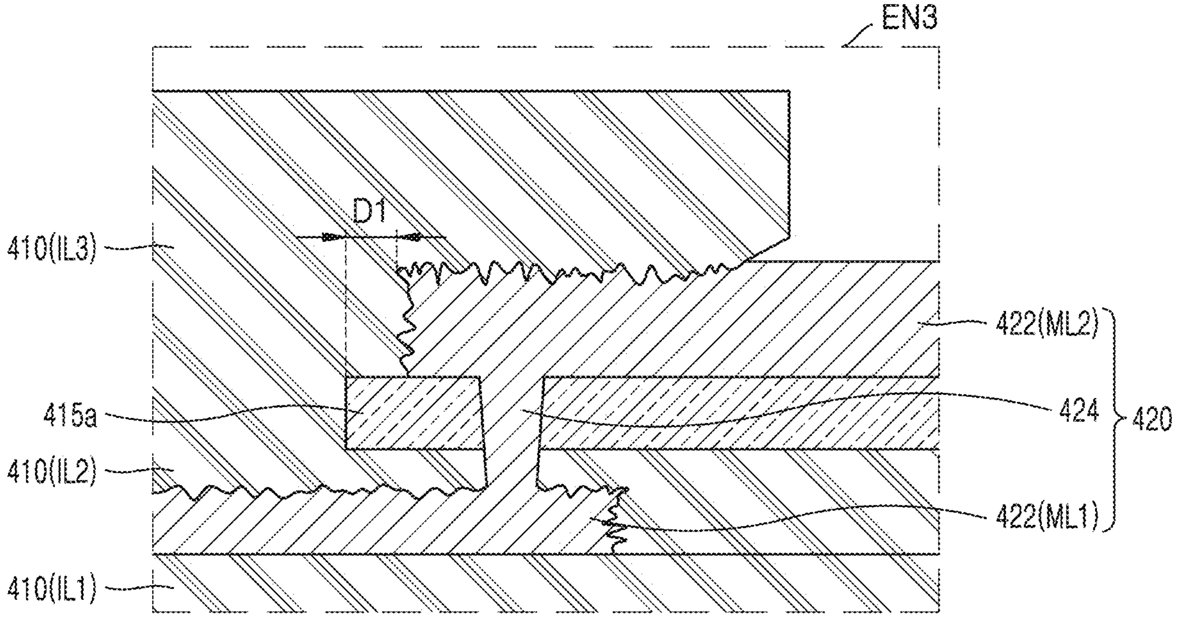

Referring to FIG. 10D, the third insulating layer IL3 covering the upper crack prevention layer **415*a* and covering a portion of the second wiring layer ML2 is formed. Afterwards, as shown in FIGS. 4A and 4B, after the upper surface connection pad PAD-U including a portion of the second wiring layer ML2 and the upper surface connection pad layer 430 is formed by forming the upper surface connection pad layer 430 in which the first upper surface metal layer 432 and the second upper surface metal layer 434 are stacked, the package connection terminal 950 may be attached onto the upper surface connection pad PAD-U to form the semiconductor package 3000** in which the upper package UP is attached onto the lower package LPb.

Figure 11A:
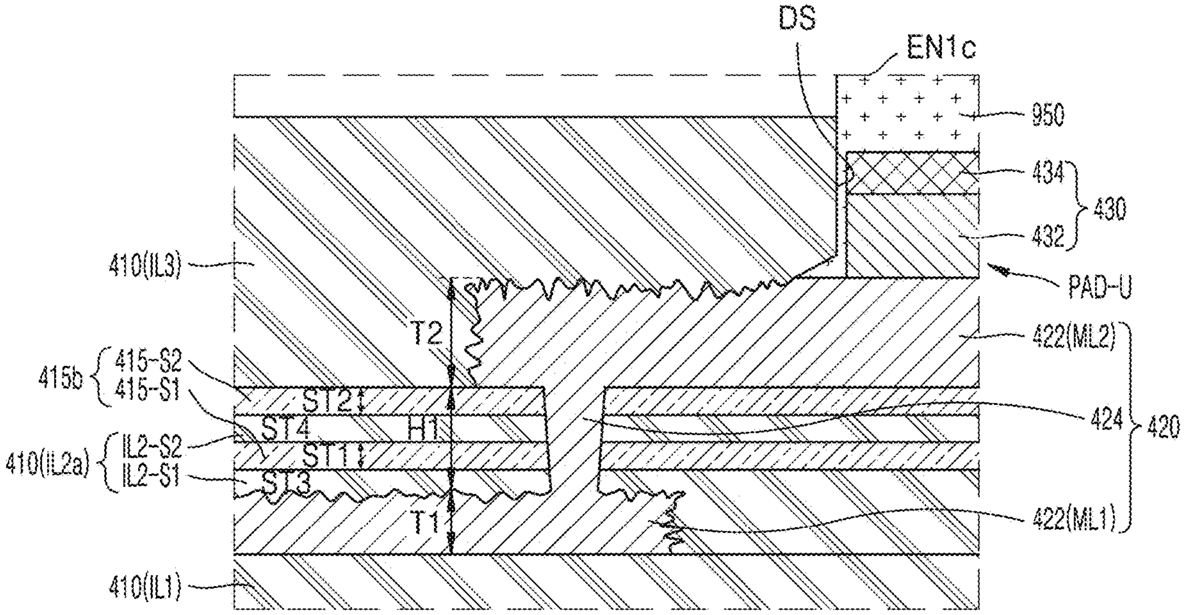
FIGS. 11A and 11B are enlarged cross-sectional views of a semiconductor package according to embodiments.
Figure 11B:
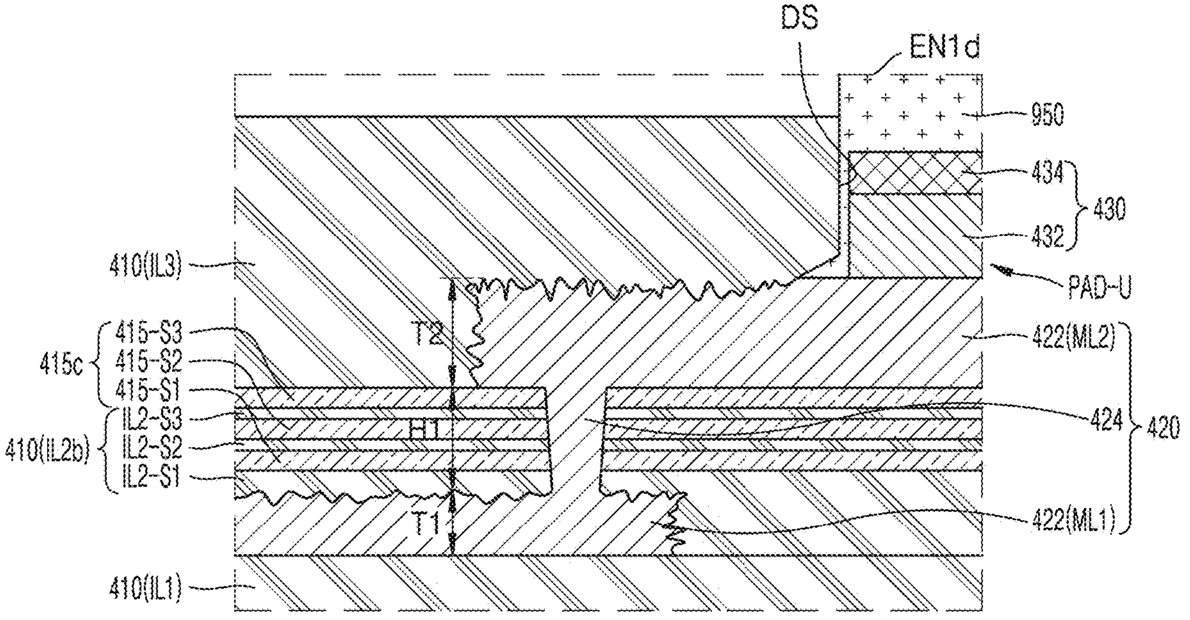

FIGS. 11A and 11B are enlarged cross-sectional views of a semiconductor package according to embodiments. FIG. 11A is an enlarged cross-sectional view of a portion (indicated as EN1*c*) corresponding to the EN1 portion of FIG. 1A, and FIG. 11B is an enlarged cross-sectional view of a portion (indicated as EN1*d*) corresponding to the EN1 portion of FIG. 1A, wherein, in FIGS. 11A and 11B, the same reference numerals as those of FIGS. 1A to 1C substantially denote the same members, and redundant descriptions given above with reference to FIGS. 1A to 1C may be omitted.

Referring to FIG. 11A, instead of the second insulating layer IL2 and the upper crack prevention layer 415 shown in FIG. 1B, a second insulating layer IL2*a* and an upper crack prevention layer **415*b*** may be formed. The second insulating layer IL2*a* may include a plurality of sub insulating layers, and the upper crack prevention layer **415*b*** may include a plurality of sub upper crack prevention layers. The sum of thicknesses of the plurality of sub upper crack prevention layers may be equal to or greater than the first thickness T1. The plurality of sub insulating layers and the plurality of sub upper crack prevention layers may be alternately stacked.

For example, when the upper crack prevention layer **415*b* includes two sub upper crack prevention layers, for example, a first sub upper crack prevention layer 415-S1 and a second sub upper crack prevention layer 415-S2, and the second insulating layer IL2***a* includes two sub insulating layers, for example, a first sub insulating layer IL2-S1 and a second sub insulating layer IL2-S2, the first sub upper crack prevention layer 415-S1 may be stacked on the first sub insulating layer IL2-S1, the second sub insulating layer IL2-S2 may be stacked on the first sub upper crack prevention layer 415-S1, and the second sub upper crack prevention layer 415-S2 may be stacked on the second sub insulating layer IL2-S2. The thickness of the first sub upper crack prevention layer 415-S1 may be a first sub thickness ST1, the thickness of the second sub upper crack prevention layer 415-S2 may be a second sub thickness ST2, the thickness of the first sub insulating layer IL2-S1 may be a third sub thickness ST3, and the thickness of the second sub insulating layer IL2-S2 may be a fourth sub thickness ST4. The sum of the first sub thickness ST1 and the second sub thickness ST2 may be equal to or greater than the first thickness T1. The sum of the third sub thickness ST3 and the fourth sub thickness ST4 may be smaller than the first thickness T1, and may be smaller than the sum of the first sub thickness ST1 and the second sub thickness ST2.

Referring to FIG. 11B, instead of the second insulating layer IL2 and the upper crack prevention layer 415 shown in FIG. 1B, a second insulating layer IL2*b* and an upper crack prevention layer 415*c* may be formed. The second insulating layer IL2*b* may include a plurality of sub insulating layers, and the upper crack prevention layer 415*c* may include a plurality of sub upper crack prevention layers. The sum of thicknesses of the plurality of sub upper crack prevention layers may be equal to or greater than the first thickness T1. The plurality of sub insulating layers and the plurality of sub upper crack prevention layers may be alternately stacked.

For example, when the upper crack prevention layer 415*c* includes three sub upper crack prevention layers, for example, the first sub upper crack prevention layer 415-S1, the second sub upper crack prevention layer 415-S2, and a third sub upper crack prevention layer 415-S3, and the second insulating layer IL2*b* includes three sub insulating layers, for example, the first sub insulating layer IL2-S1, the second sub insulating layer IL2-S2, and a third sub insulating layer IL2-S3, the first sub upper crack prevention layer 415-S1 may be stacked on the first sub insulating layer IL2-S1, the second sub insulating layer IL2-S2 may be stacked on the first sub upper crack prevention layer 415-S1, the second sub upper crack prevention layer 415-S2 may be stacked on the second sub insulating layer IL2-S2, the third sub insulating layer IL2-S3 may be stacked on the second sub upper crack prevention layer 415-S2, and the third sub upper crack prevention layer 415-S3 may be stacked on the third sub insulating layer IL2-S3.

Figure 12:
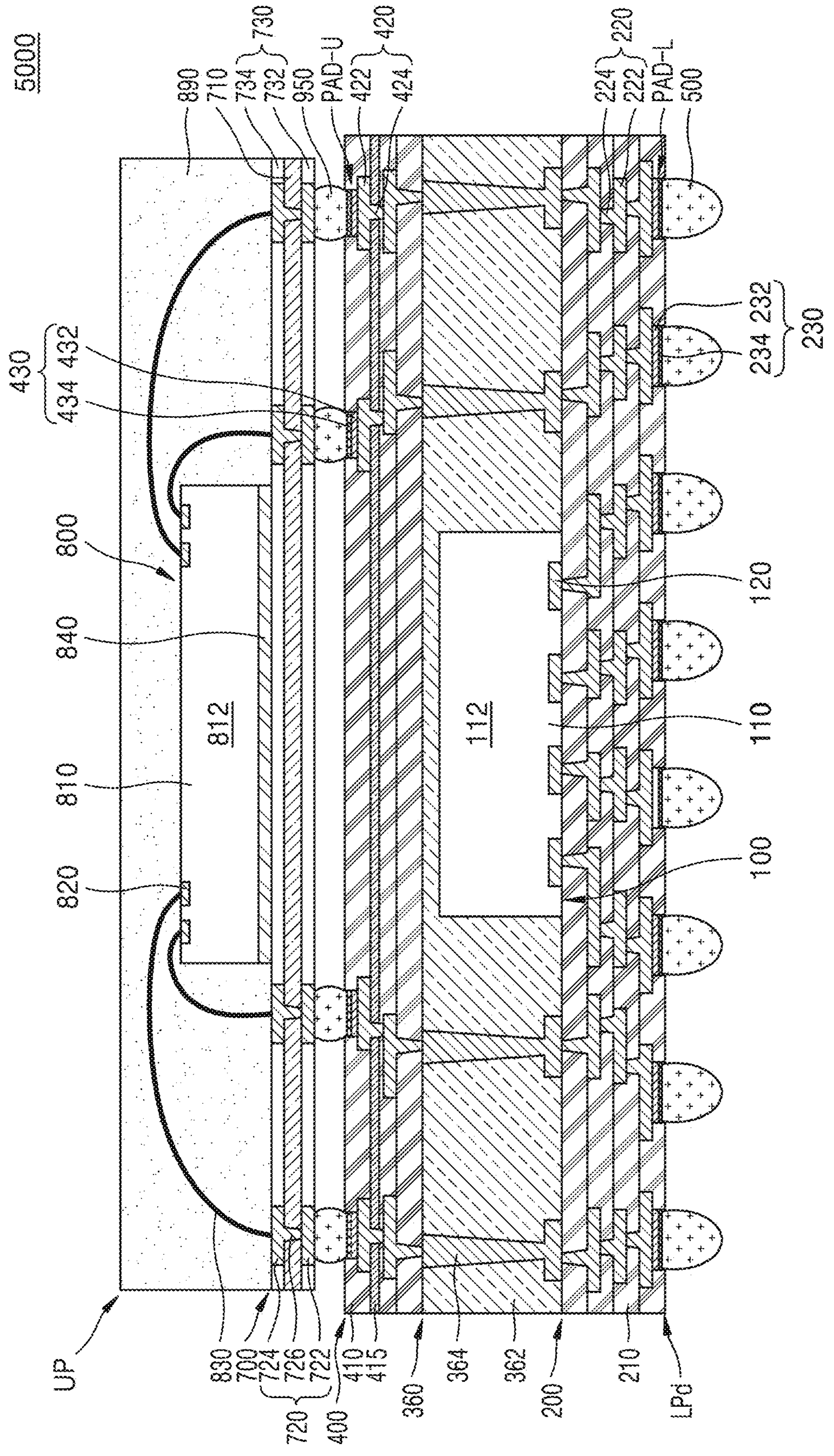
FIGS. 12 and 13 are cross-sectional views of a semiconductor packages according to embodiments.
Figure 13:
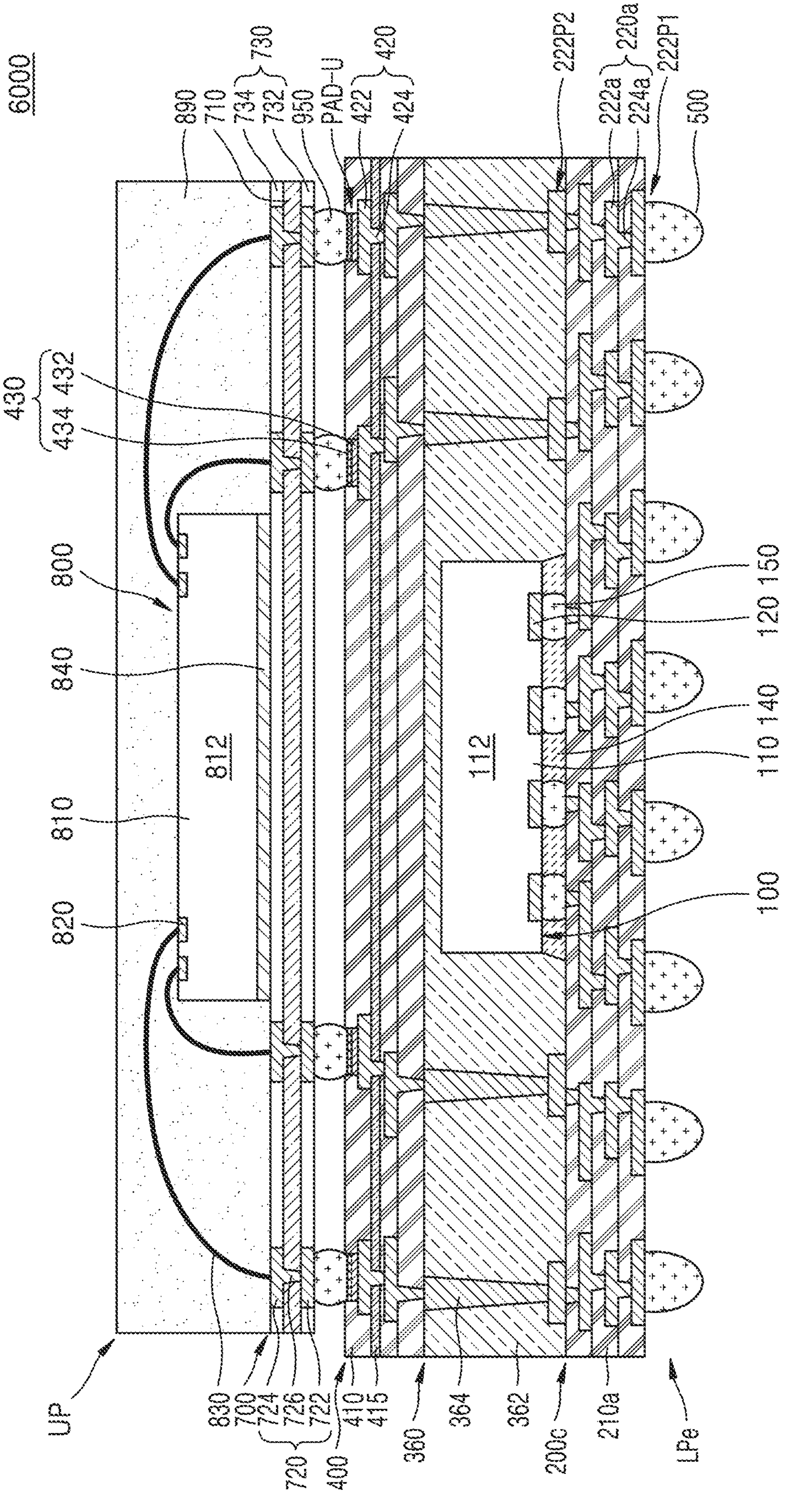

FIGS. 12 and 13 are cross-sectional views of semiconductor packages according to embodiments. In FIGS. 12 and 13, the same reference numerals as those of FIGS. 1A to 1C substantially denote the same members, and redundant descriptions given above with reference to FIGS. 1A to 1C may be omitted.

Referring to FIG. 12, a semiconductor package 5000 may be a POP including a lower package LPd and the upper package UP attached onto the lower package LPd. The lower package LPd may include the first wiring structure 200, the second wiring structure 400 on the first wiring structure 200, at least one semiconductor chip 100 arranged between the first wiring structure 200 and the second wiring structure 400, and the expanded structure 360 arranged between the first wiring structure 200 and the second wiring structure 400 and surrounding the at least one semiconductor chip 100. The expanded structure 360 may electrically connect the first wiring structure 200 with the second wiring structure 400. In some embodiments, the lower package LPd may be a fan-out-type wafer-level package (FOWLP).

The expanded structure 360 may include an encapsulant 362 and a plurality of connection structures 364. The plurality of connection structures 364 may electrically connect between the first wiring structure 200 and the second wiring structure 400 through the encapsulant 362. The plurality of connection structures 364 may perform substantially the same function as the plurality of via structures 320 shown in FIG. 1A. The plurality of connection structures 364 may include a through mold via (TMV), a conductive post, a conductive pillar, or at least one conductive bump. The encapsulant 362 may surround the at least one semiconductor chip 100 and the plurality of connection structures 364, and may fill a space between the first wiring structure 200 and the second wiring structure 400. For example, the encapsulant 362 may include an EMC.

Referring to FIG. 13, a semiconductor package 6000 may be a POP including a lower package LPe and the upper package UP attached onto the lower package LPe. The lower package LPe may include a first wiring structure 200*c*, the second wiring structure 400 on the first wiring structure 200*c*, at least one semiconductor chip 100 arranged between the first wiring structure 200*c* and the second wiring structure 400, and the expanded structure 360 arranged between the first wiring structure 200*c* and the second wiring structure 400 and surrounding the at least one semiconductor chip 100. The semiconductor package 6000 may include the first wiring structure 200*c* instead of the first wiring structure 200 of the semiconductor package 5000 shown in FIG. 12. The lower package LPe may be formed by a chip last method in which the first wiring structure 200*c* is formed, and then, the at least one semiconductor chip 100 and the expanded structure 360 are formed on the first wiring structure 200*c*.

The first wiring structure 200*c* may include a first redistribution insulating layer 210*a* and a plurality of first redistribution patterns 220*a*. The plurality of first redistribution patterns 220*a* may include a plurality of first redistribution line patterns 222*a* and a plurality of first redistribution vias 224*a*. The first redistribution insulating layer 210*a* and the plurality of first redistribution patterns 220*a* included in the first wiring structure 200*c* are generally similar to the first redistribution insulating layer 210 and the plurality of first redistribution patterns 220 included in the first wiring structure 200 shown in FIGS. 1A to 1C, respectively, and thus, redundant descriptions may be omitted.

The plurality of first redistribution vias 224*a* may contact and be connected with some of the plurality of first redistribution line patterns 222*a*, respectively, through at least one first redistribution insulating layer 210*a*. In some embodiments, the plurality of first redistribution vias 224*a* may have a tapered shape that, from a lower side to an upper side, increases in horizontal width and extends. For example, the plurality of first redistribution vias 224*a* may have a horizontal width that increases closer to the at least one semiconductor chip 100.

In some embodiments, at least some of the plurality of first redistribution line patterns 222*a* may be formed together with some of the plurality of first redistribution vias 224*a* to form an integral body. For example, the first redistribution line pattern 222*a* and the first redistribution via 224*a* which is in contact with a lower surface of the first redistribution line pattern 222*a* may be formed together to form an integral body. For example, each of the plurality of first redistribution vias 224*a* may have a horizontal width that decreases away from the first redistribution line pattern 222*a* of the integral body.

In some embodiments, a lower surface of the lowermost first redistribution insulating layer 210*a* and the uppermost surface of the plurality of first redistribution patterns 220*a*, for example, a lower surface of the lowermost first redistribution line pattern 222*a*, may be located at the same vertical level, and thus, may be coplanar with each other.

The first wiring structure 200*c* may include a plurality of lower surface connection pads 222P1 arranged on a lower surface of the first wiring structure 200*c* and a plurality of expanded connection pads 222P2 arranged on an upper surface of the first wiring structure 200*c*. In some embodiments, the plurality of lower surface connection pads 222P1 and the plurality of expanded connection pads 222P2 may be some of the plurality of first redistribution line patterns 222*a*. The plurality of external connection terminals 500 may be respectively attached to the plurality of lower surface connection pads 222P1. The plurality of connection structures 364 may be attached to some of the plurality of expanded connection pads 222P2, and a plurality of chip connection members 150 may be attached to some other thereof. The plurality of chip connection members 150 may be arranged between the plurality of chip pads 120 and some other of the plurality of expanded connection pads 222P2 to electrically connect the semiconductor chip 100 with the first wiring structure 200. In some embodiments, an under-fill layer 140 surrounding the plurality of chip connection members 150 may be arranged between the semiconductor chip 100 and the first wiring structure 200. The under-fill layer 140 may include, for example, an epoxy resin formed by a capillary under-fill method. In some embodiments, the under-fill layer 140 may be a non-conductive film (NCF).

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While embodiments of inventive concepts has been particularly shown and described with reference to presented embodiments thereof, it will be understood that various changes in form and details may be made therein without departing from the spirit and scope of the following claims.

What is claimed is:

1. A semiconductor package comprising:

a first wiring structure;

a second wiring structure on the first wiring structure;

a semiconductor chip between the first wiring structure and the second wiring structure; and an expanded structure that electrically connects the first wiring structure with the second wiring structure and surrounds the semiconductor chip, wherein the first wiring structure or the second wiring structure includes a first insulating layer on the semiconductor chip and the expanded structure, a first wiring layer on the first insulating layer, a second insulating layer covering the first insulating layer and the first wiring layer, a crack prevention layer on the second insulating layer, and a second wiring layer on the second insulating layer and the crack prevention layer, the second wiring layer includes a pad portion, the crack prevention layer overlaps the pad portion in a vertical direction and extends from an edge of the pad portion in a horizontal direction in a plan view, and the crack prevention layer is spaced apart from the first wiring layer in the vertical direction with a portion of the second insulating layer therebetween in the vertical direction.

2. The semiconductor package of claim 1, wherein the crack prevention layer completely covers a surface of the second insulating layer facing the second wiring layer.

3. The semiconductor package of claim 1, wherein the crack prevention layer only covers a portion overlapping the pad portion in the vertical direction and a portion adjacent to the edge of the pad portion in a plan view, of a surface of the second insulating layer facing the second wiring layer.

4. The semiconductor package of claim 1, wherein a thickness of the crack prevention layer is equal to or greater than a thickness of the first wiring layer.

5. The semiconductor package of claim 4, wherein the portion of the second insulating layer between the crack prevention layer and the first wiring layer has a thickness smaller than each of a thickness of the first wiring layer and a thickness of the crack prevention layer.

6. The semiconductor package of claim 1, wherein each of the first insulating layer and the second insulating layer is a redistribution insulating layer including an organic material, and the crack prevention layer comprises an organic material having a modulus lower than a modulus of the first insulating layer and a modulus of the second insulating layer.

7. The semiconductor package of claim 1, wherein each of the first insulating layer and the second insulating layer comprises an organic material, and the crack prevention layer comprises an inorganic material having a fracture toughness higher than a fracture toughness of the first insulating layer and a fracture toughness of the second insulating layer.

8. The semiconductor package of claim 1, further comprising:

a third insulating layer covering a portion of the second wiring layer and the crack prevention layer; and a connection pad layer on a portion of the pad portion not covered by the third insulating layer, wherein a side surface of the third insulating layer and a side surface of the connection pad layer are apart from each other to define a delamination space therebetween.

9. The semiconductor package of claim 8, further comprising:

a connection terminal attached to the connection pad layer, wherein the connection terminal fills at least a portion of the delamination space.

10. The semiconductor package of claim 1, wherein the first wiring structure or the second wiring structure further comprises a redistribution via, and the redistribution via electrically connects the second wiring layer with the first wiring layer through the crack prevention layer and the second insulating layer.

11. A semiconductor package comprising:

a first wiring structure including a plurality of first redistribution patterns and a plurality of first redistribution insulating layers surrounding the plurality of first redistribution patterns;

a second wiring structure on the first wiring structure, the second wiring structure including a plurality of second redistribution patterns, a plurality of second redistribution insulating layers surrounding the plurality of second redistribution patterns, a crack prevention layer, and a plurality of upper surface connection pad layers;

a semiconductor chip between the first wiring structure and the second wiring structure; and an expanded structure that electrically connects the plurality of first redistribution patterns with the plurality of second redistribution patterns and surrounds the semiconductor chip, wherein the plurality of second redistribution insulating layers include a first insulating layer, a second insulating layer, and a third insulating layer stacked on the semiconductor chip and the expanded structure, the plurality of second redistribution patterns include a first wiring layer on the first insulating layer and covered by the second insulating layer, and a second wiring layer on the second insulating layer and the crack prevention layer, the second wiring layer is partially covered by the third insulating layer, the second wiring layer includes a plurality of pad portions and a plurality of line portions extending from the plurality of pad portions, the plurality of upper surface connection pad layers are on the plurality of pad portions, such that the plurality of pad portions and the plurality of upper surface connection pad layers form a plurality of upper surface connection pads, the crack prevention layer overlaps at least some of the plurality of pad portions in a vertical direction and covers at least a portion of the second insulating layer such that the crack prevention layer is spaced apart from the first wiring layer in the vertical direction with a portion of the second insulating layer therebetween in the vertical direction, wherein an edge region of the semiconductor package surrounds a central region of the semiconductor package in a plan view.

12. The semiconductor package of claim 11, wherein the crack prevention layer completely covers an upper surface of the second insulating layer.

13. The semiconductor package of claim 11, wherein the crack prevention layer covers lower surfaces of at least some of the plurality of pad portions, and the crack prevention layer comprises a plurality of crack prevention layers having edges extending from edges of the at least some of the plurality of pad portions to outside by a first distance in a horizontal direction in a plan view.

14. The semiconductor package of claim 13, wherein the plurality of upper surface connection pads include first upper surface connection pads in the central region and second upper surface connection pads in the edge region, and the plurality of crack prevention layers are under the first upper surface connection pads in the central region and the second upper surface connection pads in the edge region.

15. The semiconductor package of claim 13, wherein the plurality of upper surface connection pads include first upper surface connection pads in the central region and second upper surface connection pads in the edge region, and the plurality of crack prevention layers are under the first upper surface connection pads in the central region and the plurality of crack prevention layers are not under the second upper surface connection pads in the edge region.

16. The semiconductor package of claim 13, wherein the plurality of upper surface connection pads include first upper surface connection pads in the central region and second upper surface connection pads in the edge region, and the plurality of crack prevention layers are under the second upper surface connection pads in the edge region and the plurality of crack prevention layers are not under the first upper surface connection pads in the central region.

17. The semiconductor package of claim 11, wherein a vertical level of an upper surface of each of the plurality of upper surface connection pad layers is lower than a vertical level of an upper surface of the third insulating layer, such that the plurality of upper surface connection pad layers are recessed into the third insulating layer, and side surfaces of at least some of the plurality of upper surface connection pad layers and a side surface of the third insulating layer are spaced apart from each other to define a delamination space therebetween.

18. A semiconductor package comprising:

a lower package including a first wiring structure including a plurality of first redistribution patterns and a plurality of first redistribution insulating layers surrounding the plurality of first redistribution patterns, a second wiring structure on the first wiring structure, the second wiring structure including a plurality of second redistribution patterns, a plurality of second redistribution insulating layers surrounding the plurality of second redistribution patterns, a crack prevention layer, and a plurality of upper surface connection pad layers, a semiconductor chip between the first wiring structure and the second wiring structure, and an expanded structure that electrically connects the plurality of first redistribution patterns with the plurality of second redistribution patterns and surrounds the semiconductor chip;

an upper package on the lower package, the upper package including an auxiliary semiconductor chip; and a plurality of package connection terminals attached to the plurality of upper surface connection pad layers, the plurality of package connection terminals electrically connecting the lower package with the upper package, wherein the plurality of second redistribution insulating layers include a first insulating layer, a second insulating layer, and a third insulating layer stacked on the semiconductor chip and the expanded structure, the plurality of second redistribution patterns include a first wiring layer on the first insulating layer and covered by the second insulating layer, and a second wiring layer on the second insulating layer and the crack prevention layer, the second wiring layer is partially covered by the third insulating layer, the second wiring layer includes a plurality of pad portions and a plurality of line portions extending from the plurality of pad portions, the plurality of upper surface connection pad layers are on the plurality of pad portions, such that the plurality of pad portions and the plurality of upper surface connection pad layers form a plurality of upper surface connection pads, and the crack prevention layer overlaps at least some of the plurality of pad portions in a vertical direction and covers at least a portion of the second insulating layer such that the crack prevention layer is spaced apart from the first wiring layer in the vertical direction with a portion of the second insulating layer therebetween in the vertical direction.

19. The semiconductor package of claim 18, wherein a thickness of the first wiring layer is 4 μm to 8 μm, a thickness of the crack prevention layer is equal to or greater than the thickness of the first wiring layer, and the thickness of the crack prevention layer is 4 μm to 10 μm.

20. The semiconductor package of claim 18, wherein the crack prevention layer comprises an organic material having a modulus lower than a modulus of each of the plurality of second redistribution insulating layers, or the crack prevention layer comprises an inorganic material having a fracture toughness higher than a fracture toughness of each of the plurality of second redistribution insulating layers.

* * * * *